US009076543B2

(12) United States Patent
Carman

(10) Patent No.: US 9,076,543 B2
(45) Date of Patent: Jul. 7, 2015

(54) TECHNIQUES FOR PROVIDING A DIRECT INJECTION SEMICONDUCTOR MEMORY DEVICE

(75) Inventor: Eric Carman, Cernex (FR)

(73) Assignee: Micron Technology, Inc., Boise, ID (US)

(*) Notice: Subject to any disclaimer, the term of this patent is extended or adjusted under 35 U.S.C. 154(b) by 756 days.

(21) Appl. No.: 12/697,780

(22) Filed: Feb. 1, 2010

(65) Prior Publication Data

US 2011/0019479 A1 Jan. 27, 2011

Related U.S. Application Data

(60) Provisional application No. 61/228,934, filed on Jul. 27, 2009.

(51) Int. Cl.
| | | |
|---|---|---|
| H01L 27/082 | (2006.01) | |
| H01L 21/00 | (2006.01) | |
| G11C 16/26 | (2006.01) | |
| H01L 27/108 | (2006.01) | |
| H01L 29/73 | (2006.01) | |

(Continued)

(52) U.S. Cl.
CPC .............. *G11C 16/26* (2013.01); *H01L 27/1023* (2013.01); *H01L 27/10802* (2013.01); *H01L 29/73* (2013.01); *H01L 29/7841* (2013.01); *G11C 11/402* (2013.01)

(58) Field of Classification Search
CPC .. G11C 16/26; G11C 11/402; H01L 27/1023; H01L 27/10802; H01L 29/73; H01L 29/7841
USPC ................... 257/566, E27.053; 438/151, 257
See application file for complete search history.

(56) References Cited

U.S. PATENT DOCUMENTS

| 3,439,214 A | 4/1969 | Kabell |
| 3,997,799 A | 12/1976 | Baker |

(Continued)

FOREIGN PATENT DOCUMENTS

| CA | 272437 | 7/1927 |
| EP | 0 030 856 | 6/1981 |

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Long Pham
(74) *Attorney, Agent, or Firm* — Wilmer Cutler Pickering Hale and Dorr LLP

(57) ABSTRACT

Techniques for providing a direct injection semiconductor memory device are disclosed. In one particular exemplary embodiment, the techniques may be realized as a direct injection semiconductor memory device including a first region coupled to a source line, a second region coupled to a bit line. The direct injection semiconductor memory device may also include a body region spaced apart from and capacitively coupled to a word line, wherein the body region is electrically floating and disposed between the first region and the second region. The direct injection semiconductor memory device may further include a third region coupled to a carrier injection line configured to inject charges into the body region through the second region.

21 Claims, 13 Drawing Sheets

(51) Int. Cl.
*H01L 29/78* (2006.01)
*G11C 11/402* (2006.01)
*H01L 27/102* (2006.01)

(56) References Cited

U.S. PATENT DOCUMENTS

| | | | |
|---|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,229,161 B1 | 5/2001 | Nemati et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 * | 11/2004 | Ikehashi et al. ............... 257/314 |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |

(56) References Cited

U.S. PATENT DOCUMENTS

| | | | |
|---|---|---|---|
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,372,734 B2 | 5/2008 | Wang |
| 7,416,943 B2 | 8/2008 | Figura et al. |
| 7,456,439 B1 | 11/2008 | Horch |
| 7,459,748 B2 | 12/2008 | Shirota et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 8,139,418 B2 | 3/2012 | Carman |
| 8,315,099 B2 | 11/2012 | Van Buskirk et al. |
| 8,400,811 B2 * | 3/2013 | Carman et al. ............. 365/72 |
| 8,587,996 B2 | 11/2013 | Luthra et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0021984 A1 * | 1/2009 | Wang ................. 365/185.18 |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2013/0077425 A1 | 3/2013 | Van Buskirk et al. |
| 2014/0071764 A1 | 3/2014 | Luthra et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |

(56) References Cited

FOREIGN PATENT DOCUMENTS

| | | |
|---|---|---|
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

(56) References Cited

OTHER PUBLICATIONS

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008; IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-Ram (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAm Cell Utilising a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.

(56) References Cited

OTHER PUBLICATIONS

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor Ram. (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-Ono (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-Ram® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

(56) References Cited

OTHER PUBLICATIONS

Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanaka et al., "Scalability Study on a Capacitorless 1T-DRAM: From Single-gate PD-SOI to Double-gate FINDRAM", 2004 IEEE, 4 pages.
Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15μm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. on El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. on El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM Cells, IEEE Electron Device Letters, vol. 30, No. 5, May 2009.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Office Action dated Oct. 3, 2012, issued for related U.S. Appl. No. 12/843,212, 47 pages.

* cited by examiner

TECHNIQUES FOR PROVIDING A DIRECT INJECTION SEMICONDUCTOR MEMORY DEVICE

CROSS-REFERENCE TO RELATED APPLICATIONS

This patent application claims priority to U.S. Provisional Patent Application No. 61/228,934, filed Jul. 27, 2009, which is hereby incorporated by reference herein in its entirety.

FIELD OF THE DISCLOSURE

The present disclosure relates generally to semiconductor memory devices and, more particularly, to techniques for providing a direct injection semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Semiconductor-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double or triple gate), and Fin-FET devices.

A semiconductor memory device may include a memory cell having a memory transistor with an electrically floating body region wherein electrical charges may be stored. The electrical charges stored in the electrically floating body region may represent a logic high (e.g., binary "1" data state) or a logic low (e.g., binary "0" data state). Also, a semiconductor memory device may be fabricated on semiconductor-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars).

In one conventional technique, the memory cell of the semiconductor memory device may be read by applying bias signals to a source/drain region and a gate of the memory transistor. As such, a conventional reading technique may involve sensing an amount of current provided/generated by/in the electrically floating body region of the memory cell in response to the application of the source/drain region and gate bias signals to determine a data state of the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and the gate of the memory transistor. As such, a conventional writing technique may result in an increase/decrease of majority charge carriers in the electrically floating body region of the memory cell which, in turn, determines the data state of the memory cell. Such an excess of majority charge carriers may result from channel impact ionization, band-to-band tunneling (gate-induced drain leakage "GIDL"), or direct injection. Majority charge carriers may be removed via drain region hole removal, source region hole removal, or drain and source region hole removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell, which, in turn, may result in an inaccurate determination of the data state of the memory cell. Furthermore, in the event that a bias signal having a voltage potential that is below a threshold voltage potential of the memory transistor is applied to the gate of the memory transistor, a channel of minority charge carriers beneath the gate may be eliminated. However, some of the minority charge carriers may remain "trapped" in interface defects. Some of the trapped minority charge carriers may combine with majority charge carriers, which may be attracted to the gate as a result of the applied bias signal. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the data state of the memory cell.

In view of the foregoing, it may be understood that there may be significant problems and shortcomings associated with conventional reading and/or writing operations in conventional floating body semiconductor memory devices.

SUMMARY OF THE DISCLOSURE

Techniques for providing a direct injection semiconductor memory device are disclosed. In one particular exemplary embodiment, the techniques may be realized as a direct injection semiconductor memory device comprising a first region coupled to a source line, a second region coupled to a bit line. The direct injection semiconductor memory device may also comprise a body region spaced apart from and capacitively coupled to a word line, wherein the body region is electrically floating and disposed between the first region and the second region. The direct injection semiconductor memory device may further comprise a third region coupled to a carrier injection line configured to inject charges into the body region through the second region.

In accordance with other aspects of this particular exemplary embodiment, the first region, the body region, and the second region may form a first bipolar transistor.

In accordance with further aspects of this particular exemplary embodiment, the body region, the second region, and the third region may form a second bipolar transistor.

In accordance with additional aspects of this particular exemplary embodiment, the carrier injection line may contact the third region.

In accordance with other aspects of this particular exemplary embodiment, the bit line may extend from the second region horizontally parallel to the source line.

In accordance with further aspects of this particular exemplary embodiment, the word line may extend from near the body region horizontally parallel to the carrier injection line.

In accordance with additional aspects of this particular exemplary embodiment, the direct injection semiconductor memory device may further comprise a fourth region disposed between the third region and a substrate.

In accordance with yet another aspect of this particular exemplary embodiment, the fourth region may be N-doped region and the substrate is a P-type substrate.

In accordance with yet another aspect of this particular exemplary embodiment, the first region and the second region may be N-doped regions.

In accordance with other aspects of this particular exemplary embodiment, the body region and the third region may be P-doped regions.

In another particular exemplary embodiment, the techniques may be realized as a method for providing a direct injection semiconductor memory device. The method may comprise coupling a first region to a source line and coupling a second region to a bit line. The method may also comprise coupling a body region spaced apart from and capacitively to a word line, wherein the body region is electrically floating and disposed between the first region and the second region. The method may further comprise coupling a third region to a carrier injection line configured to inject charges into the body region through the second region.

In accordance with other aspects of this particular exemplary embodiment, the method may further comprise increasing a voltage potential applied to at least one of the first region via the source line and the second region via the bit line from a voltage potential applied to the at least one of the first region and the second region during a hold operation to prepare for an active operation.

In accordance with further aspects of this particular exemplary embodiment, the method may further comprise increasing a voltage potential applied to the word line from a voltage potential applied to the word line during a hold operation to perform at least one of a read operation and a write logic low operation.

In accordance with additional aspects of this particular exemplary embodiment, the method may further comprise lowering a voltage potential applied to the word line from a voltage potential applied to the word line during a write logic low operation to perform a write logic high operation.

In accordance with yet another aspect of this particular exemplary embodiment, the method may further comprise increasing a voltage potential applied to the third region via the carrier injection line from a voltage potential applied to the third region during a hold operation to perform a write logic high operation.

In accordance with other aspects of this particular exemplary embodiment, the method may further comprise increasing a voltage potential applied to the second region via the bit line from a voltage potential applied during a holding operation in order to mask the write logic high operation.

In accordance with further aspects of this particular exemplary embodiment, the method may further comprise increasing a voltage potential applied to the first region via the source line from a voltage potential applied to the first region during a hold operation to perform a write logic high operation.

In accordance with additional aspects of this particular exemplary embodiment, the method may further comprise increasing a voltage potential applied to the first region via the source line from a voltage potential applied to the first region during a hold operation to perform a masking operation.

In accordance with yet another aspect of this particular exemplary embodiment, the method may further comprise increasing a voltage potential applied to the second region via the bit line from a voltage potential applied to the second region during a hold operation to perform a masking operation.

In accordance with other aspects of this particular exemplary embodiment, the voltage potential applied to the first region via the source line or the second region via the bit line may be higher than a voltage potential applied to the word line.

In accordance with further aspects of this particular exemplary embodiment, the voltage potential applied to the first region via the source line or the second region via the bit line may be higher than the voltage potential applied to the third region during a write logic high operation.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
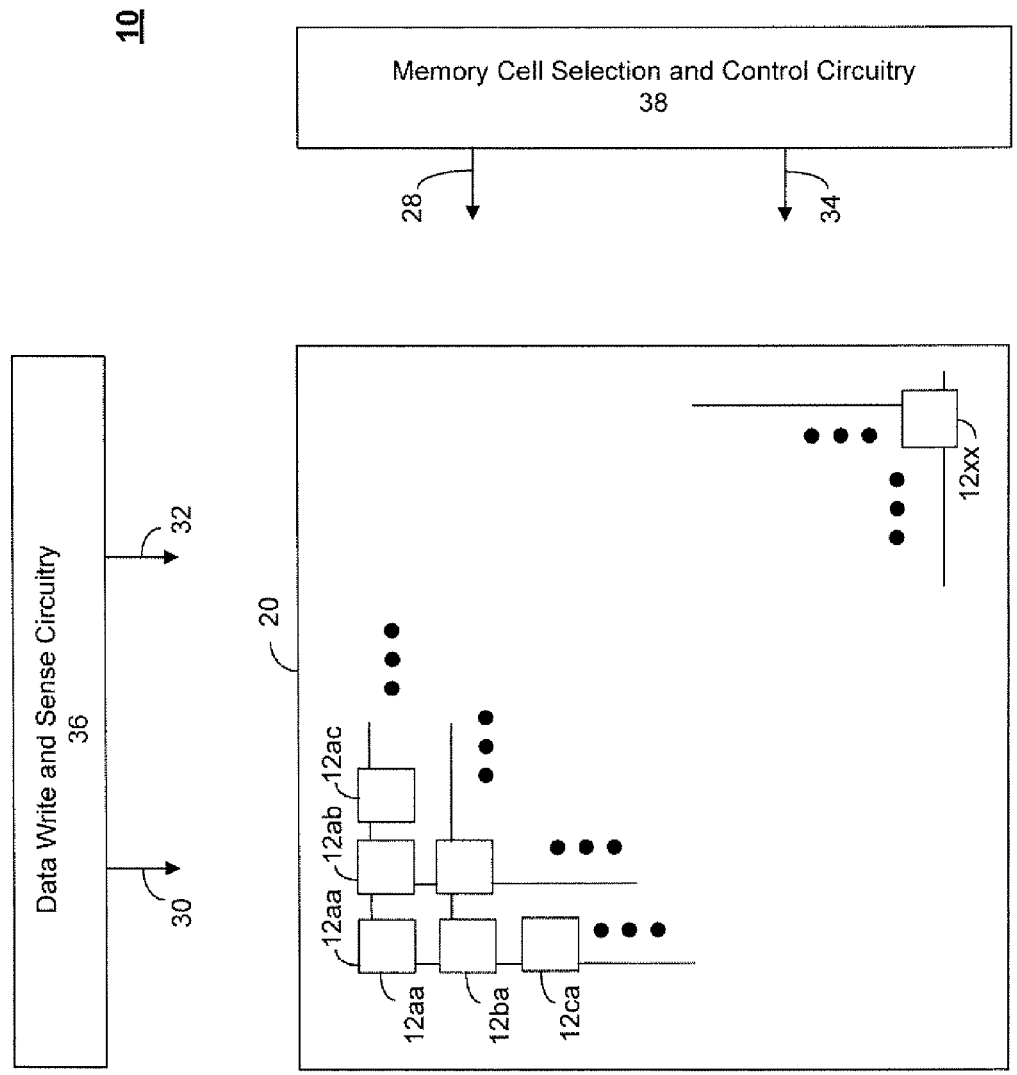
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably. The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (CN) 30 and a current or voltage reference signal. For example, each data sense amplifier may be a cross-coupled type sense amplifier to sense a data state stored in a memory cell 12.

Each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (e.g., binary "1" data state) or a logic low (e.g., binary "0" data state). It may be appreciated by one having ordinary skill in the art that various types or forms of data write and sense circuitry 36 (including one or more sense amplifiers, using voltage or current sensing techniques, to sense a data state stored in a memory cell 12) to read data stored in memory cells 12 and/or write data to memory cells 12 may be employed.

Also, the memory cell selection and control circuitry 38 may select and/or enable one or more predetermined memory cells to facilitate reading data therefrom and/or writing data thereto by applying control signals on one or more word lines (WL) 28 and/or carrier injection lines (EP) 34. The memory cell selection and control circuitry 38 may generate such control signals having address data, for example, row address data. Moreover, the memory cell selection and control circuitry 38 may include a word line decoder and/or driver. For example, the memory cell selection and control circuitry 38 may include one or more different control/selection techniques (and circuitry therefore) to select and/or enable one or more predetermined memory cells 12. Notably, all such control/selection techniques, and circuitry therefore, whether now known or later developed, are intended to fall within the scope of the present disclosure.

In an exemplary embodiment, the semiconductor memory device may implement a two step write operation whereby all the memory cells 12 in a row of memory cells 12 are written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 are selectively written to the predetermined data state (e.g., a logic high (binary "1" data state)). The semiconductor memory device 10 may also implement a one step write operation whereby selective memory cells 12 in a row of memory cells 12 are selectively written to either a logic high (e.g., binary "1" data state) or a logic low (e.g., binary "0" data state) without first implementing a "clear" operation. The semiconductor memory device 10 may employ any of the exemplary writing, holding, and/or reading techniques described herein.

The memory cells 12 may comprise N-channel, P-channel and/or both types of transistors. Indeed, circuitry that is peripheral to the memory array 20 (for example, sense amplifiers or comparators, row and column address decoders, as well as line drivers (not illustrated herein)) may include P-channel and/or N-channel type transistors. Where P-channel type transistors are employed in memory cells 12 in the memory array 20, suitable write and read voltages (for example, negative voltage potentials) should be well known to those skilled in the art in light of this disclosure. Accordingly, for sake of brevity, a discussion of such suitable voltage potentials will not be included herein.

Figure 2:
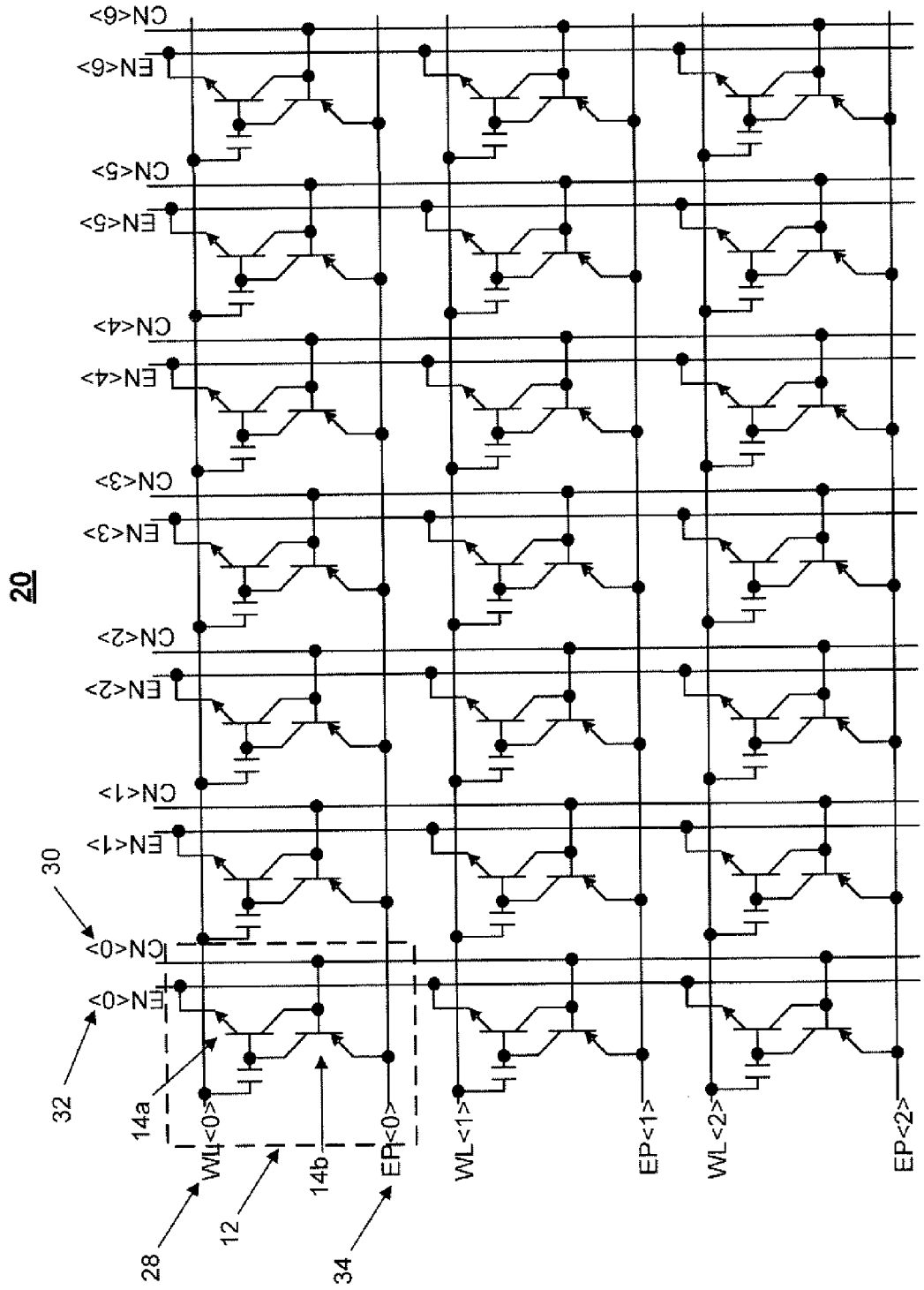
FIG. 2 shows a memory cell array having a plurality of memory cells in accordance with an embodiment of the present disclosure.

Referring to FIG. 2, there is shown a memory cell array 20 having a plurality of memory cells 12 in accordance with an embodiment of the present disclosure. Each of the memory cells may comprise a first bipolar transistor 14a and a second bipolar transistor 14b coupled to each other. For example, the first bipolar transistor 14a and/or the second bipolar transistor 14b may be an NPN bipolar transistor or an PNP bipolar transistor. As illustrated in FIG. 2, the first bipolar transistor 14a may be an NPN bipolar transistor and the second bipolar transistor 14b may be an PNP bipolar transistor. In another exemplary embodiment, the first memory transistor 14a may be an PNP bipolar transistor and the second memory transistor 14b may be an NPN bipolar transistor. The memory cells 12 may be coupled to a respective word line (WL) 28, a respective bit line (CN) 30, a respective source line (EN) 32, and/or a respective carrier injection line (EP) 34. Data may be written to or read from a selected memory cell 12 by applying suitable control signals to a selected word line (WL) 28, a selected bit line (CN) 30, a selected source line (EN) 32, and/or a selected carrier injection line (EP) 34. In an exemplary embodiment, the word line (WL) 28 may extend horizontally parallel to the carrier injection line (EP) 34.

In an exemplary embodiment, one or more respective bit line (CN) 30 may be coupled to one or more data sense amplifiers of the data write and sense circuitry 36. For example, one or more control signals may be applied to one or more selected memory cells 12 via a selected word line (WL) 28, a selected bit line (CN) 30, a selected source line (EN) 32, and/or a selected carrier injection line (EP) 34. A voltage and/or a current may be generated by the one or more selected memory cells 12 and outputted to the data write and sense circuitry 36 via a corresponding bit line (CN) 30. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from and/or written to the memory cell 12 via the bit line (CN) 30, then the bit line (CN) 30 may be coupled to the data sense amplifier of the data write and sense circuitry 36 while the source line (EN) 32 may be separately controlled via a voltage/current source (e.g., a voltage/current driver) of the data write and sense circuitry 36. In an exemplary embodiment, the data sense amplifier of the data write and sense circuitry 36 and the voltage/current source of the data write and sense circuitry 36 may be configured on opposite sides of the memory cell array 20.

In another exemplary embodiment, a voltage and/or current generated by the one or more selected memory cells 12 may be outputted to the data write and sense circuitry 36 via a corresponding source line (EN) 32. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from the memory cell 12 via the source line (EN) 32 and a data state is written to the memory cell 12 via the bit line (CN) 30, then the source line (EN) 32 may be coupled to the data sense amplifier of the data write and sense circuitry 36. For example, the bit line (CN) 30 and the source line (EN) 32 may be coupled to disparate subcircuits (e.g., drivers and/or sense amplifiers) of the data write and sense circuitry 36 configured on opposite sides of the memory cell array 20. In an exemplary embodiment, the bit line (CN) 30 may be coupled to a driver and/or a sense amplifier circuitry of the data write and sense circuitry 36, while the source line (EN) 32 may be coupled to a driver of the data write and sense circuitry 36. Also, the driver and/or the sense amplifier circuitry coupled to the bit line (CN) 30 and the driver coupled to the source line (EN) 32 may be configured on opposite sides of the memory cell array 20. By reading a data state via the source line (EN) 32 and writing a data state via the bit line (CN) 30, the resistance at the memory cell 12 may be reduced because the source line (EN) 32 and the bit line (CN) 30 are driven separately.

Figure 3:
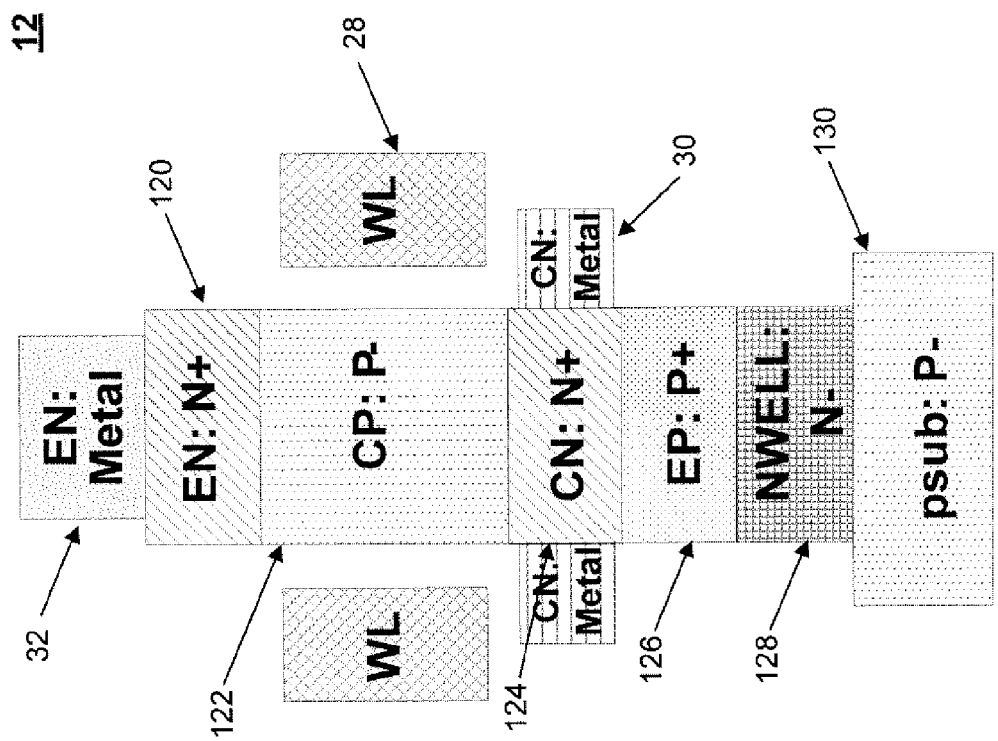
FIG. 3 shows a cross-sectional view of a memory cell in accordance with an embodiment of the present disclosure.

Referring to FIG. 3, there is shown a cross-sectional view of the memory cell 12 shown in FIG. 1 in accordance with an embodiment of the present disclosure. As discussed above, the memory cell 12 may comprise two bipolar transistors. In an exemplary embodiment, the first bipolar transistor 14a may be a NPN bipolar transistor and the second bipolar transistor 14b may be a PNP bipolar transistor. In an exemplary embodiment, the first bipolar transistor 14a and the second bipolar transistor 14b may share one or more common regions. The first NPN bipolar transistor 14a may comprise an N+ emitter region 120, a P− base region 122, and an N+ collector region 124. The second PNP bipolar transistor 14b may comprise the P− collector region 122, the N+ base region 124, and a P+ emitter region 126. The N+ region 120, the P− region 122, the N+ region 124, and/or the P+ region 126 may be disposed in sequential contiguous relationship within a pillar or fin configuration that may extend vertically or perpendicularly to a plane defined by an N-well region 128 and/or a P− substrate 130. In an exemplary embodiment, the P− region 122 may be an electrically floating body region of the memory cell 12 configured to accumulate/store charges that may be spaced apart from and capacitively coupled to the word line (WL) 28.

The N+ emitter region 120 of the first bipolar transistor 14a may be coupled to the source line (EN) 32 formed of a metal layer. Also, the P− base region 122 of the first bipolar transistor 14a and/or the P− collector region 122 of the second bipolar transistor 14b may be capacitively coupled to the word line (WL) 28 formed of a metal layer. In another exemplary embodiment, the N+ region 124 of the memory cell 12 may be coupled to a bit line (CN) 30 formed of a metal layer. The bit line (CN) 30 may circumferentially surround the N+ region 124 of the memory cell 12. The bit line (CN) 30 may reduce a disturbance to the memory cell 12. In particular, the bit line (CN) 30 may be formed of a metal layer and therefore may reduce a hole disturbance to the memory cell 12. The bit line (CN) 30 may extend horizontally in parallel to the source line (EN) 32 coupling to a plurality of memory cells 12 (e.g., a column of memory cells 12). For example, the bit line (CN) 30 and the source line (EN) 32 may be arranged in different planes and configured to be parallel to each other. The source line (EN) 32 may provide an alternative means for addressing or accessing the memory cell 12. The memory cell 12 may be addressed or accessed via either the bit line (CN) 30 or the source line (EN) 32, or the combination of the bit line (CN) 30 and the source line (EN) 32.

Figure 4:
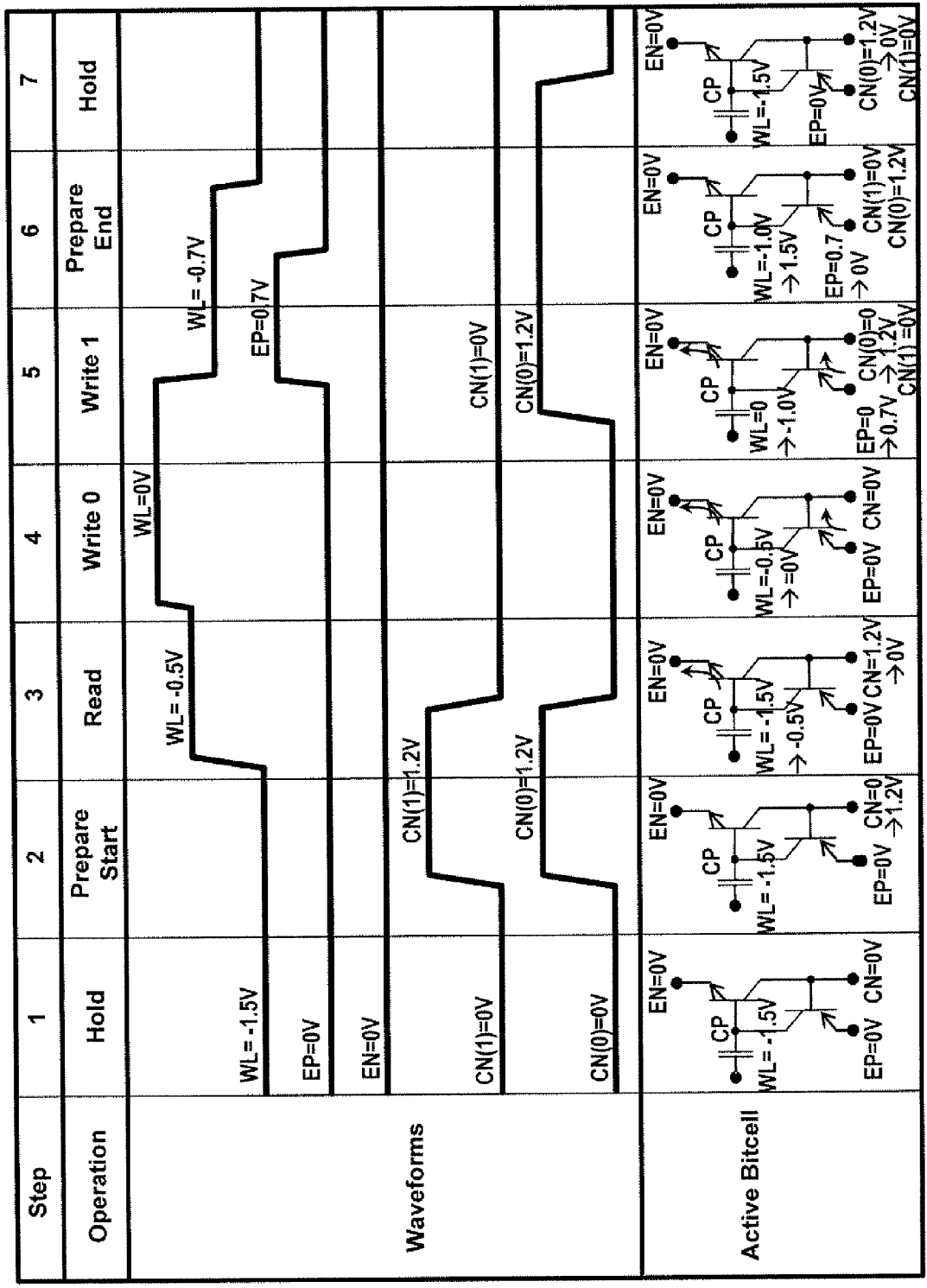
FIG. 4 shows control signal voltage waveforms for performing a refresh operation in accordance with an embodiment of the present disclosure.

Referring to FIG. 4, there are shown control signal voltage waveforms for performing a refresh operation in accordance with an embodiment of the present disclosure. For example, the refresh operation may include control signals configured to perform one or more operations. In an exemplary embodiment, the refresh operation may include control signals to perform a preparation to start operation, a read operation, a write logic low (e.g., binary "0" data state) operation, a write logic high (e.g., binary "1" data state) operation, and/or preparation to end operation. Prior to performing a refresh operation, the control signals may be configured to perform a hold operation in order to maintain a data state (e.g., a logic high (binary "1" data state) or a logic low (binary "0" data state)) stored the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to the P− region 122 of the memory cell 12 while the voltage potential applied to other regions (e.g., the N+ region 120, the N+ region 124, and/or the P+ region 126) may be maintained at 0V. For example, the negative voltage potential applied to the word line (WL) 28 (e.g., capacitively coupled to the P− region 122 of the memory cell 12) may be −1.5V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include control signals to perform a preparation to start operation where the control signals may be applied to a memory cell 12 in order to prepare the memory cell 12 for one or more subsequent operations (e.g., a read operation and/or a write operation). For example, control signals applied to a memory cell 12 may be configured to minimize a time delay between voltages applied to the N+ region 124 of the memory cell 12 and the word line (WL) 28 in order to reduce a disturbance. For example, when a 0V is applied to the source line (EN) 32, a 1.2V is applied to the bit line (CN) (at the start of a read operation), and a −1.5V is applied to the word line (WL) 28, an electric field may be created across the junction from the P− region 122 and the N+ region 124. The electric field may cause a leakage (e.g., in a logic high (binary "1" data state) or an increase (e.g., in a logic low (binary "0" data state)) of charge stored in the memory cell 12, or band-to-band tunneling (e.g., gate-induced drain leakage "GIDL"). Therefore, control signals applied to a memory cell 12 during the preparation to start operation may be configured to reduce band-to-band tunneling (e.g., gate-induced drain leakage "GIDL"). In an exemplary embodiment, a positive voltage potential may be applied to the N+ region 124 of the memory cell 12, while the voltage potential applied to other regions (e.g., the N+ region 120, the capacitively coupled P− region 122 via the word line (WL) 28, and/or the P+ region 126) of the memory cell 12 may be maintained at the same voltage potential applied during the hold operation. The positive voltage potential applied to the N+ region 124 of the memory cell 12 may be raised to 1.2V while the voltage potential applied to other regions of the memory cell 12 may be 0V.

In another exemplary embodiment, a refresh operation may include control signals configured to perform a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (CN) 30. In an exemplary embodiment, a voltage potential applied to the word line (WL) 28 (e.g., capacitively coupled to the P− region 122) and/or a voltage potential applied to the N+ region 124 via the bit line (CN) 30 may be initially (e.g., at the start of the read operation) raised to a predetermined voltage potential. In another exemplary embodiment, when the memory cell 12 has been prepared for the read operation (e.g., prepare to start operation as discussed above), the voltage potential applied to the N+ region 124 of the memory cell 12 may initially (e.g., at the start of the read operation) remain the same as the voltage potential applied during the preparation to start operation. For example, the voltage potential applied to the word line (WL) 28 (e.g., capacitively coupled to the P− region 122 of the memory cell 12) may be −0.5V, while the voltage potential applied to the N+ region 124 of the memory cell 12 may be 1.2V. In an exemplary embodiment, when the voltage potential applied to the N+ region 124 of the memory cell 12 via the bit line (CN) 30 then drops to 0V and when a logic high (e.g., binary "1" data state) is stored in the memory cell 12, the junction between the P− region 122 and the N+ region 124 may become forward biased and switch the first bipolar transistor 14a to an "ON" state. When the first bipolar transistor 14a switches to an "ON" state, a change in voltage potential and/or current maybe generated in the memory cell 12. This change in voltage potential and/or current may be outputted to and detected by a data sense amplifier via the bit line (CN) 30 coupled to the N+ region 124. In another exemplary embodiment, when the voltage potential applied to the N+ region 124 of the memory cell 12 then drops to 0V and a logic low (e.g., binary "0" data state) is stored in the memory cell 12, the junction between the P− region 122 and the N+ region 124 may remain reverse biased and the first bipolar transistor 14a may remain in an "OFF" state. When the first bipolar transistor 14a remains in the "OFF" state, no change in voltage potential and/or current is generated in the memory cell 12. Thus, a data sense amplifier may detect no change in voltage potential and/or current via the bit line (CN) 30 coupled to the N+ region 124. The drop in the voltage potential applied to the N+ region 124 during the read operation may not switch the second bipolar transistor 14b to an "ON" state. The second bipolar transistor 14b may remain in an "OFF" state during the read operation.

In other exemplary embodiments, a refresh operation may include control signals configured to perform a write logic low (e.g., binary "0" data state) operation where the control signals may be configured to perform one or more write operations to one or more selected memory cells 12 of one or more selected rows of the memory cell array 20. For example, the write logic low (e.g., binary "0" data state) operation may be performed on one or more selected rows of the memory cell array 20, or the entire memory cell array 20, and a subsequent write logic high (e.g., binary "1" data state) operation may be performed on one or more selected memory cells 12. For example, a voltage potential applied to the word line (WL) 28 may be adjusted, such that the voltage potential at the P− region 122 (e.g., by capacitively coupling to the word line (WL) 28) may be higher than a voltage potential applied to the bit line (CN) 30 and/or the source line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P− region 122) may be raised to 0V. In the event that a logic high (e.g., binary "1" data state) is stored in the memory cell 12, the junction between the N+ region 120 and the P− region 122 may be reverse biased and the junction between the P− region 122 and the N+ region 124 may be forward biased and a logic low (e.g., binary "0" data state) may be written to the P− region 122 (e.g., majority charges accumulated in the P− region 122 may be depleted via the bit line (CN) 30). In the event that a logic low (e.g., binary "0" data state) is stored in the memory cell 12, the junction between the N+ region 120 and the P− region 122 may not be forward biased and the junction between the P− region 122 and the N+ region 124 may or may not be forward biased and the logic low (e.g., binary "0" data state) may be maintained in the memory cell 12. In an exemplary embodiment, when no charges or a small amount of charges are accumulated in the P− region 122 to indicate a logic low (e.g., binary "0" data state) is stored in the memory cell 12, the junction between the P− region 122 and the N+ region 124 is not forward biased and the logic low (e.g., binary "0" data state) may be maintained in the memory cell 12. However, when a larger amount of charges are accumulated in the P− region 122 to indicate a logic low (e.g., binary "0" data state) is stored in the memory cell 12, the junction between the P− region 122 and the N+ region 124 may be forward biased to deplete excessive charges stored in the P− region 122 to maintain a logic low (e.g., binary "0" data state) in the memory cell 12.

In another exemplary embodiment, a memory operation may include control signals configured to perform a write logic high (e.g., binary "1" data state) operation where the control signals may be configured to write a logic high (e.g., binary "1" data state) to the one or more selected memory cells 12. For example, a predetermined voltage potential may be applied to the word line (WL) 28 (e.g., capacitively coupled to the P− region 122), the N+ region 124 via the bit line (CN) 30, the N+ region 120 via the source line (EN) 32, and/or the P+ region via the carrier injection line (EP) 34. In an exemplary embodiment, a voltage potential applied to the word line (WL) 28 (e.g., capacitively coupled to the P− region 122) may be raised to 0V. In order to write a logic high (e.g., binary "1" data state) to the memory cell 12, the voltage potential applied to the N+ region 124 of the memory cell 12 may be maintained at 0V. The voltage potential applied to the word line (WL) 28 (e.g., capacitively coupled to the P− region 122) may be lowered to −0.7V from 0V, while the voltage potential applied to the P+ region 126 via the carrier injection line (EP) 34 may be raised to 0.7V from 0V. Under such biasing, the junction between the N+ region 120 and the P− region 122 may be reverse biased and the junction between the P− region 122 and the N+ region 124 may become forward biased so that a logic high (e.g., binary "1" data state) may be written to the P− region 122 (e.g., charge injection into the P− region 122 from the P+ region 126). In order to maintain a logic low (e.g., binary "0" data state) in one or more unselected memory cells 12, a masking operation may be performed on the one or more selected memory cells 12. For example, the voltage potential applied to the N+ region 124 of the one or more selected memory cells 12 may be raised to 1.2V in order to prevent charge flow into the P− region 122 from the P+ region 126. Under such biasing, the junction between the N+ region 120 and the P− region 122 may not be forward biased and the junction between the P+ region 126 and the N+ region 124 may be reverse biased to prevent the second bipolar transistor 14b switch to an "ON" state and prevent charge flow so that the logic low (e.g., binary "0" data state) may be maintained in the memory cell 12.

The refresh operation may also include control signals configured to perform a preparation to end operation. During the preparation to end operation, the voltage potentials applied to the memory cells 12 may adjust the amount of charge (e.g., an indication of data state) stored in the memory cells 12. In an exemplary embodiment, a voltage potential applied to the P+ region 126 via the carrier injection line (EP) 34 may be lowered to 0V in order to stop the injection of charges into the P− region 122. As discussed above, the P− region 122 may be charged to approximately 0.7V above the voltage potential at the N+ region 124 during the write logic high (e.g., binary "1" data state) operation. The voltage potential applied to the word line (WL) 28 (e.g., capacitively coupled to the P− region 122) may be lowered to −1.5V and may determine an amount of charge (e.g., an indication of data state) stored in the P− region 122 of the memory cells 12. Also, a voltage potential applied to the N+ region 124 via the bit line (CN) 30 may remain at 1.2V during the preparation to end operation in order to maintain the second bipolar transistor 14b in the "OFF" state. After the refresh operation, the voltage potentials applied to the memory cells 12 may be returned to the hold operation in order to retain a data state (e.g., logic low (binary "0" data state) or logic high (binary "1" data state)).

Figure 5:
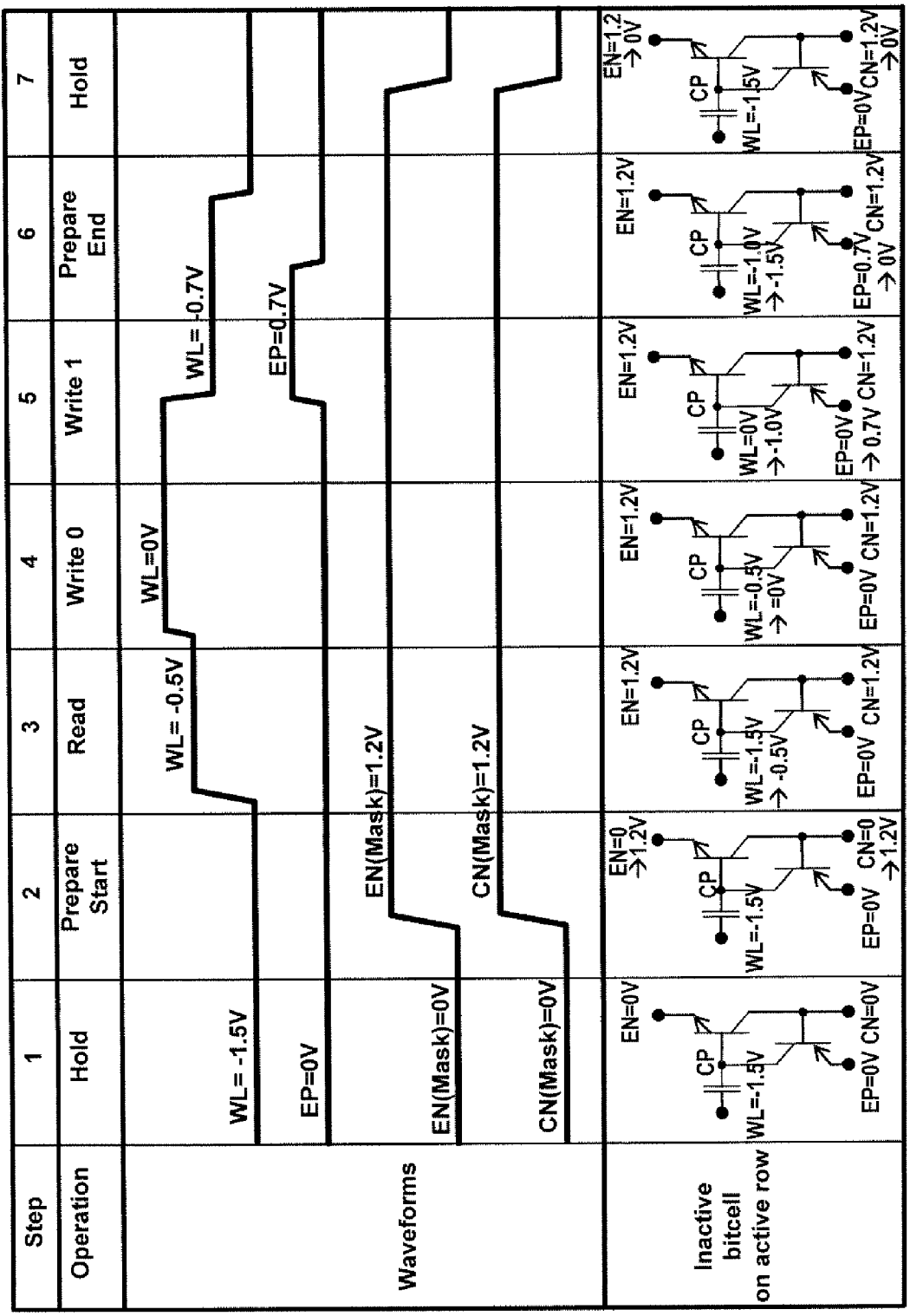
FIG. 5 shows control signal voltage waveforms of a masking operation performed on one or more unselected memory cells along an active row to reduce a disturbance during active operations in accordance with an embodiment of the present disclosure.

Referring to FIG. 5, there are shown control signal voltage waveforms of a masking operation performed on one or more unselected memory cells 12 along an active row to reduce a disturbance during active operations in accordance with an embodiment of the present disclosure. For example, during one or more active operations (e.g., read operation, write operation, sense operation, preparation operation, and/or refresh operation), voltage potentials may be applied to every memory cell 12 along the active row via the word line (WL) 28 and/or the carrier injection line (EP) 34. However, the active operations may be performed on one or more selected memory cells 12 along the active row and one or more unselected memory cells 12 along the active row may experience a disturbance caused by the voltage potentials applied via the word line (WL) 28 and/or the carrier injection line (EP) 34 during the active operations. In order to reduce a disturbance experienced by the one or more unselected memory cells 12 along an active row, a masking operation may be performed on the one or more unselected memory cells 12.

In an exemplary embodiment, during a masking operation, a voltage potential may be applied to the one or more unselected memory cells 12 on an active row via the bit line (CN) 30 and/or the source line (EN) 32. The voltage potential applied via the corresponding bit line (CN) 30 and/or the source line (EN) 32 to the one or more unselected memory cells 12 on the active row may be raised to a predetermined voltage potential above the voltage potential applied to the word line (WL) 28 and/or the carrier injection line (EP) 34. In an exemplary embodiment, the voltage potential applied to the bit line (CN) 30 and/or the source line (EN) 32 associated with the one or more unselected memory cells 12 along the active row may be 0.7V above a voltage potential applied to the word line (WL) 28 and/or the carrier injection line (EP) 34. As shown in FIG. 5, the voltage potential applied to the bit line (CN) 30 and/or the source line (EN) 32 associated with the one or more unselected memory cells 12 along the active row may be 1.2V in order to reduce a disturbance of the active operations.

Figure 6:
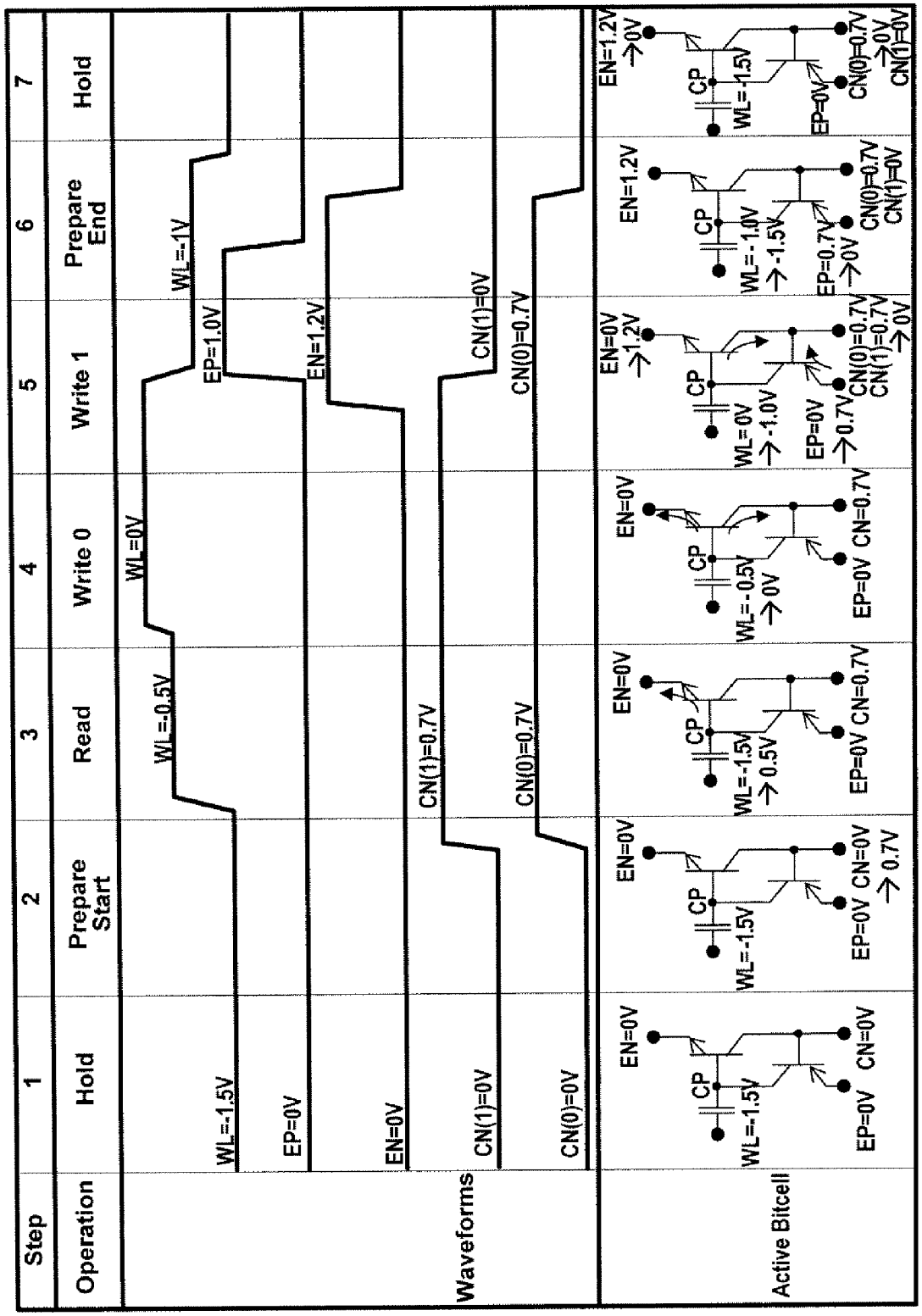
FIG. 6 shows control signal voltage waveforms for performing an alternative refresh operation in accordance with an embodiment of the present disclosure.

Referring to FIG. 6, there are shown an alternative control signal voltage waveforms for performing a refresh operation in accordance with an embodiment of the present disclosure. For example, the refresh operation may include control signals configured to perform one or more operations. In an exemplary embodiment, the refresh operation may include a preparation to start operation, a read operation, a write logic low (e.g., binary "0" data state) operation, a write logic high (e.g., binary "1" data state) operation, and/or preparation to end operation. Prior to performing a refresh operation, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to the P− region 122 of the memory cell 12 while voltage potential applied to other regions (e.g., the N+ region 120, the N+ region 124, and/or the P+ region 126) may be maintained at 0V. For example, the negative voltage potential applied to the word line (WL) 28 (e.g., capacitively coupled to the P− region 122 of the memory cell 12) may be −1.5V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include a preparation to start operation where the control signals may be applied to a memory cell 12 in order to prepare the memory cell 12 for one or more subsequent operations (e.g., a read operation and/or a write operation). For example, control signals applied to a memory cell 12 may be configured to minimize time delay between voltages applied to the N+ region 124 of the memory cell 12 and the word line (WL) 28 in order to reduce a disturbance. For example, when a 0V is applied to the source line (EN) 32, a 0.7V is applied to the bit line (CN) 30 (at the start of a read operation), and a −1.5V is applied to the word line (WL) 28, an electric field may be created across the junction from the P− region 122 and the N+ region 124. The electric field may cause a leakage (e.g., in a logic high (e.g., binary "1" data state) or an increase (e.g., in a logic low (e.g., binary "0" data state) of amount of charge stored in the memory cell 12, or band-to-band tunneling (e.g., gate-induced drain leakage "GIDL"). Therefore, control signals applied to a memory cell 12 during the preparation to start operation may be configured to reduce band-to-band tunneling (e.g., gate-induced drain leakage "GIDL"). In an exemplary embodiment, a positive voltage potential may be applied to the N+ region 124 of the memory cell 12, while the voltage potential applied to other regions (e.g., the N+ region 120, the capacitively coupled P− region 122 via the word line (WL) 28, and/or the P+ region 126) of the memory cell 12 may be maintained the same as the voltage potential applied during the hold operation. The positive voltage potential applied to the N+ region 124 of the memory cell 12 may be raised to 0.7V, while the voltage potential applied to other regions of the memory cell 12 may be 0V.

In another exemplary embodiment, a refresh operation may include a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (CN) 30. In an exemplary embodiment, a voltage potential applied to the word line (WL) 28 (e.g., capacitively coupled to the P− region 122) and/or a voltage potential applied to the N+ region 124 via the bit line (CN) 30 may be raised to a predetermined voltage potential. In another exemplary embodiment, in the event that the memory cell 12 is prepared for the read operation (e.g., prepare to start operation as discussed above), the voltage potential applied to the N+ region 124 of the memory cell 12 may remain the same as the voltage potential applied during the preparation to start operation. For example, the voltage potential applied to the word line (WL) 28 (e.g., capacitively coupled to the P− region 122 of the memory cell 12) may be −0.5V, while the voltage potential applied to the N+ region 124 of the memory cell 12 may be 0.7V.

In an exemplary embodiment, when the voltage potential applied to the word line (WL) 28 (e.g., capacitively coupled to the P− region 122 of the memory cell 12) may be raised to −0.5V and in the event that a logic high (e.g., binary "1" data state) is stored in the memory cell 12, the junction between the P− region 122 and the N+ region 120 may become forward biased. The voltage or current may be generated when forward biasing the junction between the P− region 122 and the N+ region 120 may be outputted to a data sense amplifier via the bit line (CN) 30 coupled to the N+ region 124 or via the source line (EN) 32 coupled to the N+ region 120. In another exemplary embodiment, when the voltage potential applied to the word line (WL) 28 (e.g., capacitively coupled to the P− region 122 of the memory cell 12) is raised to −0.5V and when a logic low (e.g., binary "0" data state) is stored in the memory cell 12, the junction between the P− region 122 and the N+ region 120 may remain reverse biased or become weakly forward biased (e.g., above the reverse bias voltage and below forward bias threshold voltage or the voltage potential at the p-diffusion region is higher than the voltage potential at the n-diffusion region). No voltage or current may be generated when the junction between the P− region 122 and the N+ region 120 is reverse biased or weakly forward biased and a data sense amplifier may detect no voltage or current via the bit line (CN) 30 coupled to the N+ region 124 or via the source line (EN) 32 coupled to the N+ region 120. The voltage potential applied during a read operation may not turn the second bipolar transistor 14b to an "ON" state. The second bipolar transistor 14b may remain in an "OFF" state during the read operation.

In other exemplary embodiments, a refresh operation may include a write logic low (e.g., binary "0" data state) operation where the control signals may be configured to perform one or more write operations to one or more selected memory cells 12 of one or more selected rows of the memory cell array 20. For example, the write logic low (e.g., binary "0" data state) operation may be performed on one or more selected rows of the memory cell array 20 or the entire memory cell array 20 and a subsequent write logic high (e.g., binary "1" data state) operation may be performed on one or more selected memory cells 12. For example, a voltage potential applied to the word line (WL) 28 may be adjusted, such that the voltage potential at the P− region 122 (e.g., by capacitively coupling to the word line (WL) 28) may be higher than a voltage potential applied to the bit line (CN) 30 and/or the source line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P− region 122) may be raised to 0V. Also, a voltage potential applied to the bit line (CN) 30 may remain the same as the voltage potential applied during the read operation (e.g., 0.7V). Power may be saved by eliminating switching or maintaining the voltage potential applied via the bit line (CN) during the read operation and the write logic low (e.g., binary "0" data state). In an exemplary embodiment, when the voltage potential applied to the word line (WL) 28 (e.g., capacitively coupled to the P− region 122 of the memory cell 12) is raised to 0V and the voltage potential applied to the N+ region 124 via the bit line (CN) 30 is maintained at 0.7V, and a logic high (e.g., binary "1" data state) is stored in the memory cell 12, the first bipolar transistor 14a (e.g., regions 120-124) may be turned "ON" and the second bipolar transistor 14b (e.g., regions 122-126) may be turned "OFF" to remove charges from the P− region 122 through the forward biased junction between the P− region 122 and the N+ region 120. (In another exemplary embodiment, when the voltage potential applied to the N+ region 124 via the bit line (CN) 30 is maintained at 0.7 and a logic low (e.g., binary "0" data state) is stored in the memory cell 12, the junction between the N+ region 120 and the P− region 122 may not be forward biased and the junction between the P− region 122 and the N+ region 124 may not be forward biased, thus the logic low (e.g., binary "0" data state) may be maintained in the memory cell 12.

As discussed above, the voltage potential applied to N+ region 124 via the bit line (CN) 30 may be lowered to 0V from 0.7V during the write logic low (e.g., binary "0" data state) operation. In the event that the voltage potential applied to the N+ region 124 is lowered to 0V, the junction between N+ region 120 and the P− region 122 and the junction between the P− region 122 and the N+ region 124 may be forward biased and charges stored in the P− region 122 may be depleted via the N+ region 120 and/or the region 124. In other exemplary embodiments, the write logic low (e.g., binary "0" data state)

operation may be performed via the word line (WL) 28. For example, a voltage potential may be applied to the word line (WL) 28 to create a depletion region within the P− region 122. The voltage potential applied to the word line (WL) 28 may be sufficient to create a depletion region within the P− region 122 that may extend from N+ region 120 to N+ region 124 within the P− region 122. The depletion region within the P− region 122 may couple the N+ region 120, the P− region 122, and the N+ region 124 to each other and may create a single region including the N+ region 120, the P− region 122, and the N+ region 124. The charges stored in the P− region 122 may be depleted via the N+ region 120 and/or the N+ region 124.

In another exemplary embodiment, a refresh operation may include a write logic high (e.g., binary "1" data state) operation where the control signals may be configured to write a logic high (e.g., binary "1" data state) to the one or more selected memory cells 12. For example, a predetermined voltage potential may be applied to the word line (WL) 28 (e.g., capacitively coupled to the P− region 122), the N+ region 124 via the bit line (CN) 30, the N+ region 120 via the source line (EN) 32, and/or the P+ region via the carrier injection line (EP) 34. In an exemplary embodiment, in preparation to perform the write logic high (e.g., binary "1" data state) operation, the voltage potential applied to the N+ region 124 of the one or more selected memory cells 12 may be lowered to 0V. The voltage potential applied to the N+ region 124 of the one or more unselected memory cells 12 may be maintained at 0.7V or higher (e.g., 1.2V) in order to prevent a write logic high (e.g., binary "1" data state) operation. Simultaneously to or subsequent to lowering the voltage potential applied to the N+ region 124, the voltage potential applied to the N+ region 120 via the source line (EN) 32 may be raised to a voltage potential of 1.2V. After applying the desired voltage potential to the N+ region 120 and/or the N+ region 124, a voltage potential applied to the P+ region 126 via the carrier injection line (EP) 34 may be raised to 1.2V. Further, the voltage potential applied to the word line (WL) 28 (e.g., capacitively coupled to the P− region 122) may be lowered to −1.0V.

Under such biasing, the junction between the N+ region 120 and the P− region 122 may be reverse biased and the junction between the P− region 122 and the N+ region 124 may become forward biased so that a logic high (e.g., binary "1" data state) may be written to the P− region 122 (e.g., charge injection into the P− region 122 from the P+ region 126). As more charges are accumulated in the P− region 122, the voltage potential at the P− region 122 may increase to approximately 0.7V to 1.0V above the voltage potential at N+ region 124. At this time, the first bipolar transistor 14a may start to turn to an "ON" state and the current generated by the first bipolar transistor 14a may increase the voltage potential at N+ region 124 due to resistive voltage potential drop on the bit line (CN) 30. The increase of the voltage potential at N+ region 124 may lead to a decrease of current flow in the second bipolar transistor 14b which in term may cause a decrease in the current load on the carrier injection line (EP) 34 after the write logic high (e.g., binary "1" data state) operation has been completed. In other exemplary embodiments, the N+ region 124 may be floating after pre-charged to a predetermined voltage potential (e.g., 0V as discussed above) in order to reduce a current flow within the second bipolar transistor 14b. Thus, during a write logic high (e.g., binary "1" data state) operation, the first bipolar transistor 14a may easily increase the voltage potential at the N+ region 124 when the P− region 122 is fully charged.

In order to maintain a logic low (e.g., binary "0" data state) in one or more unselected memory cells 12, a masking operation may be performed on the one or more selected memory cells 12. For example, the voltage potential applied to the N+ region 124 of the one or more selected memory cells 12 may be maintained at 0.7V or higher (e.g., 1.2V) in order to prevent charge flow into the P− region 122 from the P+ region 126 via the N+ region 124. Under such biasing, the junction between the N+ region 120 and the P− region 122 may not be forward biased and the junction between the P+ region 126 and the N+ region 124 may be reverse biased or weakly forward biased or become weakly forward biased (e.g., above the reverse bias voltage and below forward bias threshold voltage) to prevent charge flow and the logic low (e.g., binary "0" data state) may be maintained in the memory cell 12.

The refresh operation may also include a preparation to end operation. During the preparation to end operation, the voltage potentials applied to the memory cells 12 may adjust the amount of charge or data state stored in the P− region 122 of the memory cells 12. In an exemplary embodiment, a voltage potential applied to the P+ region 126 via the carrier injection line (EP) 34 may be lowered to 0V in order to switch the second bipolar transistor 14b to an "OFF" state. As discussed above, the P− region 122 may be charged to approximately 0.7V above the voltage potential at the N+ region 124 during the write logic high (e.g., binary "1" data state) operation. The voltage potential applied to the word line (WL) 28 (e.g., capacitively coupled to the P− region 122) may be lowered to −1.5V and may determine an amount of charge or data state stored in the P− region 122 of the memory cells 12. In an exemplary embodiment, the P− region 122 of the memory cell 12 may be charged to approximately 0.7V when the voltage potential applied on the word line (WL) 28 is −1.0V, however, when the voltage potential on the word line (WL) 28 is lowered to −1.5V (e.g., a holding voltage potential) the voltage potential at the P− region 122 may be lowered by some fraction of 0.5V due to the capacitive coupling of the voltage potential to the word line (WL) 28.

The voltage potential applied to the word line (WL) 28 during the write logic high (e.g., binary "1" data state) may be selected based on one or more factors. For example, the one or more factors may include a disturbance (e.g., disturbance may increase with an increase in the amount of charge stored in the P− region 122 of the memory cells 12), charge time (e.g., charge time may increase with an increase in the amount of charge stored in the P− region 122 of the memory cells 12), and retention time (e.g., retention time may decrease with a decrease in the amount of charge stored in the P− region 122 of the memory cells 12). Also, a voltage potential applied to the N+ region 124 via the bit line (CN) 30 may remain at 1.2V during the preparation to end operation in order to maintain the second bipolar transistor 14b in the "OFF" state. After the refresh operation, the voltage potentials applied to the memory cells 12 may be returned to the hold operation in order to retain a data state (e.g., logic low (binary "0" data state) or logic high (binary "1" data state)).

Figure 7:
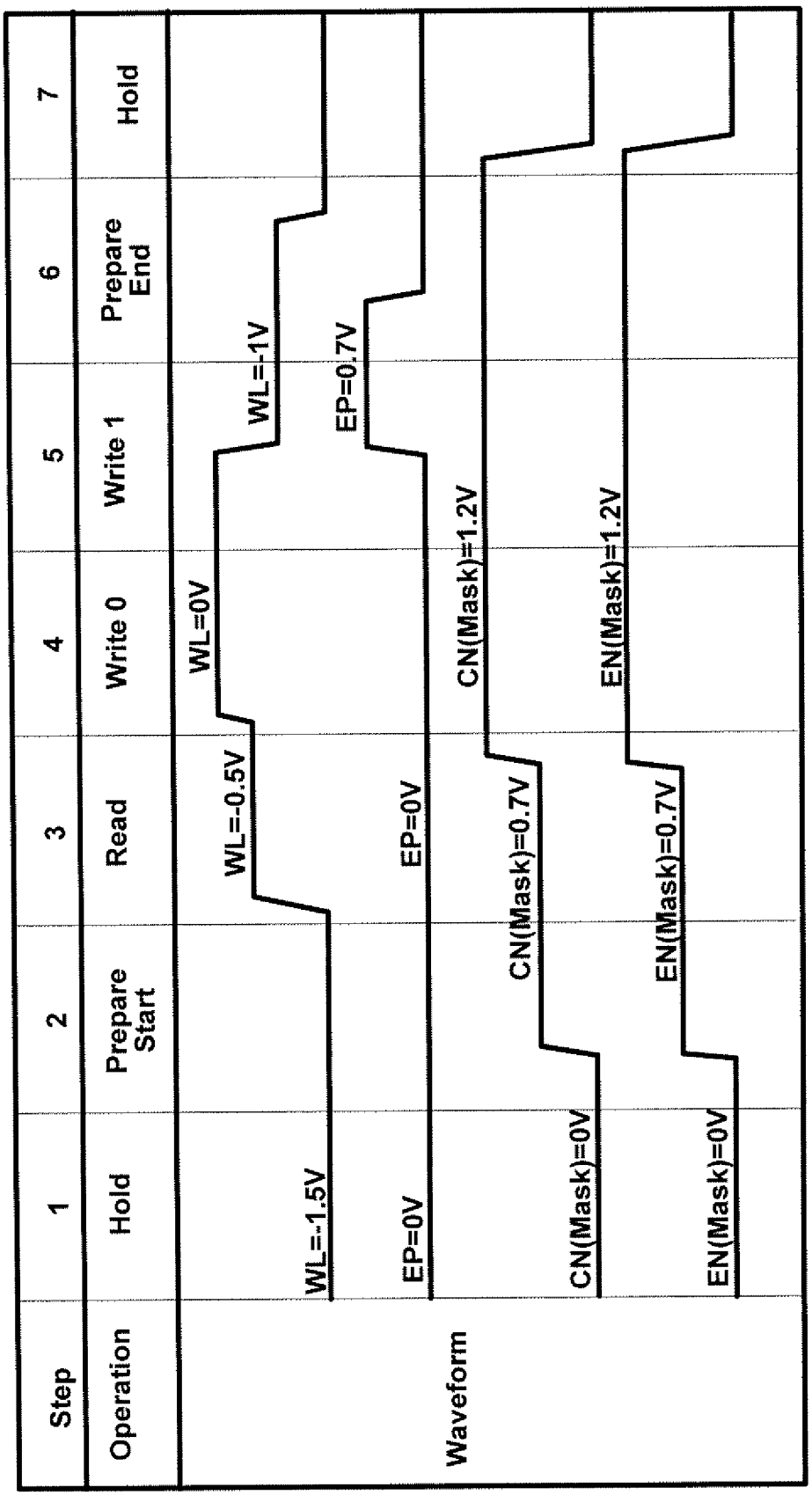
FIG. 7 shows control signal voltage waveforms of an alternative masking operation performed on one or more unselected memory cells along an active row to reduce a disturbance during active operations in accordance with an embodiment of the present disclosure.

Referring to FIG. 7, there are shown control signal voltage waveforms of an alternative masking operation performed on one or more unselected memory cells 12 along an active row to reduce a disturbance during active operations in accordance with an embodiment of the present disclosure. For example, during one or more active operations (e.g., read operation, write operation, sense operation, preparation operation, and/or refresh operation), voltage potentials may be applied to every memory cell 12 along the active row via the word line (WL) 28 and/or the carrier injection line (EP) 34. However, the active operations may be performed on one or more selected memory cells 12 along the active row and one or more unselected memory cells 12 along the active row may experience a disturbance caused by the voltage potentials applied via the word line (WL) 28 and/or the carrier injection line (EP) 34 during the active operations. In order to reduce a disturbance experienced by the one or more unselected memory cells 12 along an active row, a masking operation may be performed on the one or more unselected memory cells 12.

In an exemplary embodiment, during a masking operation, a voltage potential may be applied to the one or more unselected memory cells 12 on an active row via the corresponding bit line (CN) 30 and/or the source line (EN) 32. The voltage potential applied via the corresponding bit line (CN) 30 and/or the source line (EN) 32 to the one or more unselected memory cells 12 on an active row via the corresponding bit line (CN) 30 and/or the source line (EN) 32 may vary based on one or more operations performed on the active row. The voltage potential applied to the one or more unselected memory cells 12 on the active row may be raised to a predetermined voltage potential above the voltage potential applied to the word line (WL) 28 and/or the carrier injection line (EP) 34. In an exemplary embodiment, the voltage potential applied to the bit line (CN) 30 and/or the source line (EN) 32 associated with the one or more unselected memory cells along the active row may be 1.2V above a voltage potential applied to the word line (WL) 28 and may be similar to or greater than a voltage potential applied to the carrier injection line (EP) 34.

As shown in FIG. 7, the voltage potential applied to the bit line (CN) 30 and/or the source line (EN) 32 associated with the one or more unselected memory cells 12 along the active row may be 0.7V during a preparation to start operation and/or a read operation order to reduce a disturbance caused by the one or more active operations. The voltage potential on the word line (WL) 28 may increase to perform different active operations, the voltage potential applied on the bit line (CN) and/or the source line (EN) 32 may also increase corresponding to the increase on the word line (WL) 28. In an exemplary embodiment, the voltage potential on the word line (WL) 28 may increase by 0.5V (e.g., from –0.5V to 0V) in order to perform a write logic low (e.g., binary "0" data state) operation and/or a write logic high (e.g., binary "1" data state) operation, the voltage potential applied to the bit line (CN) 30 and/or the source line (EN) 32 may also increase by 0.5V (e.g., from 0.7V to 1.2V) in order to reduce a disturbance caused by the one or more active operations.

Figure 8:
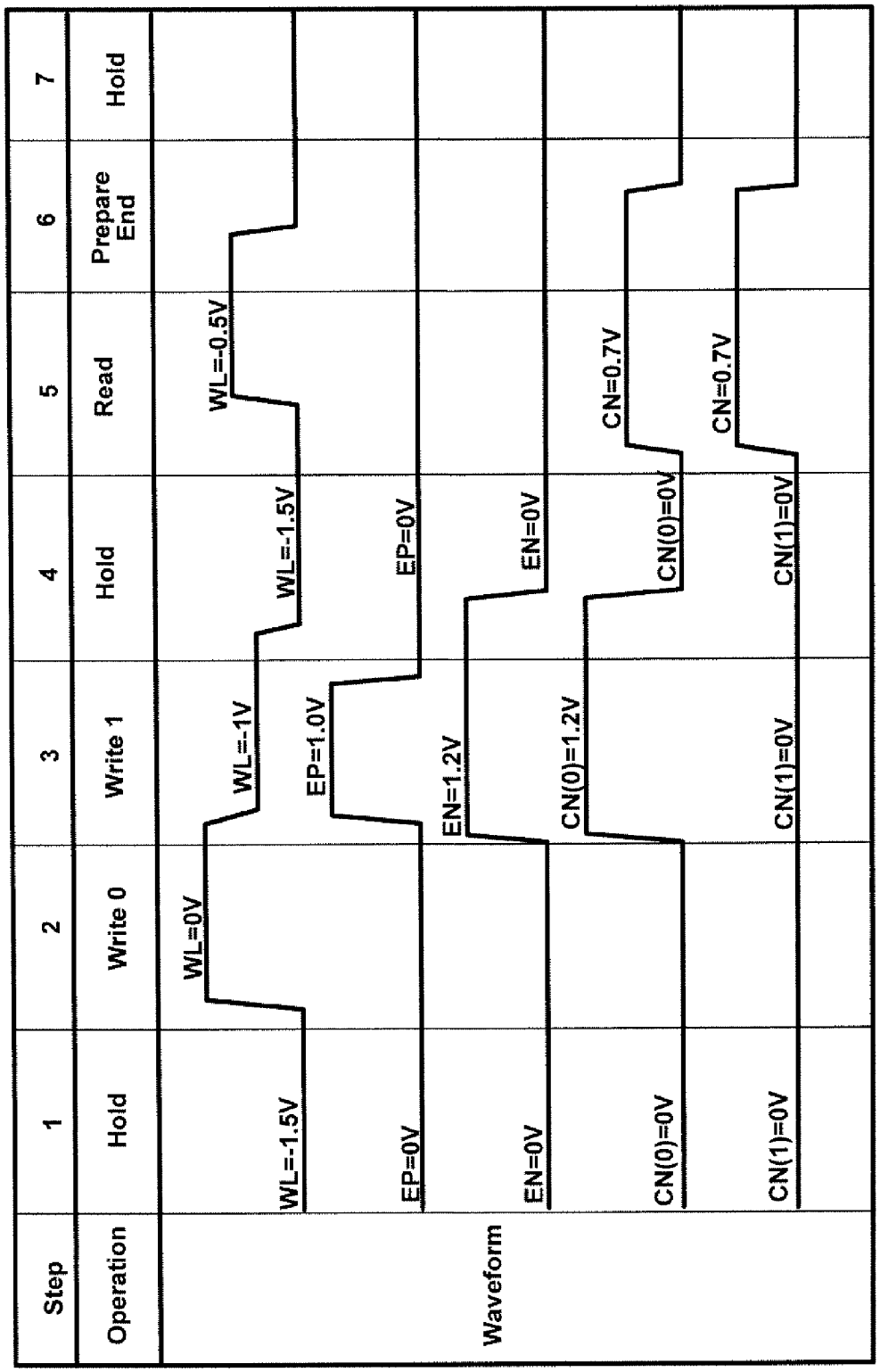
FIG. 8 shows control signal voltage waveforms for performing a write operation followed by a read operation in accordance with an embodiment of the present disclosure.

Referring to FIG. 8, there are shown control signal voltage waveforms for performing a write operation followed by a read operation in accordance with an embodiment of the present disclosure. For example, the write operation followed by a read operation may include control signals configured to perform one or more operations. In an exemplary embodiment, the write operation followed by a read operation may include a write logic low (e.g., binary "0" data state) operation, a write logic high (e.g., binary "1" data state) operation, a hold operation, a read operation, and/or a preparation to end operation. Prior to performing a write operation followed by a read operation, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate activities or field (e.g., electrical fields between junctions which may lead to leakage of charges) within the memory cell 12.

In an exemplary embodiment, during a hold operation, a negative voltage potential may be applied to the word line (WL) 28 that may be capacitively coupled to the P– region 122 of the memory cell 12, while voltage potentials applied to other regions (e.g., the N+ region 120, the N+ region 124, and/or the P+ region 126) may be maintained at 0V. For example, the negative voltage potential applied to the word line (WL) 28 (e.g., capacitively coupled to the P– region 122 of the memory cell 12) may be –1.5V. During the hold operation, the junction between the N+ region 124 and the P– region 122 and the junction between the N+ region 120 and the P– region 122 may be reverse biased in order to retain a data state (e.g., a logic high (binary "1" data state) or a logic low (binary "0" data state)) stored in the memory cell 12.

In another exemplary embodiments, a write operation followed by a read operation may include a write logic low (e.g., binary "0" data state) operation where the control signals may be configured to perform one or more write operations to one or more selected memory cells 12 of one or more selected rows of the memory cell array 20. For example, the write logic low (e.g., binary "0" data state) operation may be performed on one or more selected rows of the memory cell array 20 or the entire memory cell array 20 and a subsequent write logic high (e.g., binary "1" data state) operation may be performed on one or more selected memory cells 12. For example, a voltage potential applied to the word line (WL) 28 may be adjusted, such that the voltage potential at the P– region 122 (e.g., by capacitively coupling to the word line (WL) 28) may be higher than a voltage potential applied to the bit line (CN) 30 and/or the source line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P– region 122) may be raised to 0V. Also, a voltage potential applied to the bit line (CN) 30 may remain the same as the voltage potential applied during the hold operation. In an exemplary embodiment, the voltage potential applied to the N+ region 124 via the bit line (CN) 30 may be maintained at 0V during the write logic low (e.g., binary "1" data state) operation. In the event that the voltage potential applied to the N+ region 124 is maintained at 0V, the junction between N+ region 120 and the P– region 122 and the junction between the P– region 122 and the N+ region 124 may be forward biased and charges may be depleted from the P– region 122 via the N+ region 120 and/or the N+ region 124.

In other exemplary embodiments, a write operation followed by a read operation may include a write logic high (e.g., binary "1" data state) operation where the control signals may be configured to write a logic high (e.g., binary "1" data state) to the one or more selected memory cells 12. For example, a predetermined voltage potential may be applied to the word line (WL) 28 (e.g., capacitively coupled to the P– region 122), the N+ region 124 via the bit line (CN) 30, the N+ region 120 via the source line (EN) 32, and/or the P+ region via the carrier injection line (EP) 34. In an exemplary embodiment, the voltage potential applied to the N+ region 124 of the one or more selected memory cells 12 to perform the write logic high (e.g., binary "1" data state) operation on one or more selected memory cells 12 along an active row may be maintained at 0V. The voltage potential applied to the N+ region 124 of the one or more unselected memory cells 12 along an active row may be raised to 1.2V (e.g., 0.7V or higher) in order to prevent a write logic high (e.g., binary "1" data state) operation. The voltage potential applied to the N+ region 120 via the source line (EN) may be raised to a voltage potential of 1.2V. Simultaneously to or subsequent to applying the desired voltage potential to the N+ region 120 and/or the N+ region 124, a voltage potential applied to the P+ region 126 via the carrier injection line (EP) 34 may be raised to 1.0V. Further, the voltage potential applied to the word line (WL) 28 (e.g., capacitively coupled to the P− region 122) may be lowered to −1.0V from 0V.

Under such biasing, the junction between the N+ region 120 and the P− region 122 may be reverse biased and the junction between the P− region 122 and the N+ region 124 may become forward biased so that a logic high (e.g., binary "1" data state) may be written to the P− region 122 (e.g., charge injection into the P− region 122 from the P+ region 126). As more charges are accumulated/stored in the P− region 122, the voltage potential at the P− region 122 may increase to approximately 0.7V to 1.0V above the voltage potential at the N+ region 124. At this time, the first bipolar transistor 14a may start to turn to an "ON" state and the current generated by the first bipolar transistor 14a may increase the voltage potential at the N+ region 124 due to resistive voltage potential drop on the bit line (CN) 30. The increase of the voltage potential at the N+ region 124 may lead to a decrease of current flow in the second bipolar transistor 14b which in term may cause a decrease in the current load on the carrier injection line (EP) 34 after a write logic high (e.g., binary "1" data state) operation has been completed. In other exemplary embodiments, the N+ region 124 may be floating after being pre-charged to a predetermined voltage potential (e.g., 0V as discussed above) in order to reduce a current flow within the second bipolar transistor 14b. Thus, during a write logic high (e.g., binary "1" data state) operation, the first bipolar transistor 14a may easily increase a voltage potential at the N+ region 124 when the P− region 122 is fully charged.

In order to maintain a logic low (e.g., binary "0" data state) in one or more unselected memory cells 12 along an active row, a masking operation may be performed on the one or more unselected memory cells 12. For example, the voltage potential applied to the N+ region 124 of the one or more selected memory cells 12 may be maintained at 1.2V (or 0.7V or higher) in order to prevent charge flow into or accumulation in the P− region 122 from the P+ region 126. Under such biasing, the junction between the N+ region 120 and the P− region 122 may not be forward biased and the junction between the P+ region 126 and the N+ region 124 may be reverse biased to prevent charge flow and the logic low (e.g., binary "0" data state) may be maintained in the memory cell 12.

After performing a write logic high (e.g., binary "1" data state) operation, the voltage potential applied to the memory cells 12 may be adjusted to perform a hold operation (e.g., in a similar manner as a hold operation as discussed above). Subsequent to the hold operation, a read operation may be performed where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (CN) 30. In an exemplary embodiment, a voltage potential applied to the word line (WL) 28 (e.g., capacitively coupled to the P− region 122) and/or a voltage potential applied to the N+ region 124 via the bit line (CN) 30 may be raised to a predetermined voltage potential. In another exemplary embodiment, the voltage potential applied to the word line (WL) 28 (e.g., capacitively coupled to P− region 122 of the memory cell 12) may be −0.5V, while the voltage potential applied to the N+ region 124 of the memory cell 12 may be 0.7V.

In an exemplary embodiment, when the voltage potential applied to the word line (WL) 28 (e.g., capacitively coupled to the P− region 122 of the memory cell 12) raised to −0.5V and in the event that a logic high (e.g., binary "1" data state) is stored in the memory cell 12, the junction between the P− region 122 and the N+ region 122 may become forward biased. When the first bipolar transistor 14a switches to the "ON" state, change in voltage or current may be generated in the memory cell 12. This change in voltage and/or current may be outputted to and detected by a data sense amplifier via the bit line (CN) 30 coupled to the N+ region 124 or via the source line (EN) 32 coupled to the N+ region 120. In another exemplary embodiment, when the voltage potential applied to the word line (WL) 28 (e.g., capacitively coupled to the P− region 122 of the memory cell 12) may be raised to −0.5V and in the event that a logic low (e.g., binary "0" data state) is stored in the memory cell 12, the junction between the P− region 122 and the N+ region 120 may remain reverse biased or become weakly forward biased (e.g., above the reverse bias voltage and below forward bias threshold voltage). When the first bipolar transistor 14a remains in the "OFF" state, no change in voltage and/or current is generated in the memory cell 12. Thus, a data sense amplifier may detect no change in voltage or current via the bit line (CN) 30 coupled to the N+ region 124 or via the source line (EN) 32 coupled to the N+ region 120. The increase in the voltage potential applied to the N+ region 124 during the read operation may not switch the second bipolar transistor 14b to an "ON" state. The second bipolar transistor 14b may remain in an "OFF" state during the read operation.

The write operation followed by a read operation may also include a preparation to end operation. During the preparation to end operation, the voltage potentials applied to the memory cells 12 may adjust an amount of charge (e.g., an indication of data state) stored in the memory cells 12. In an exemplary embodiment, the voltage potential applied to the memory cells 12 may return to the voltage potential during the hold operation and the memory cells 12 may store a data state during the hold operation.

Figure 9:
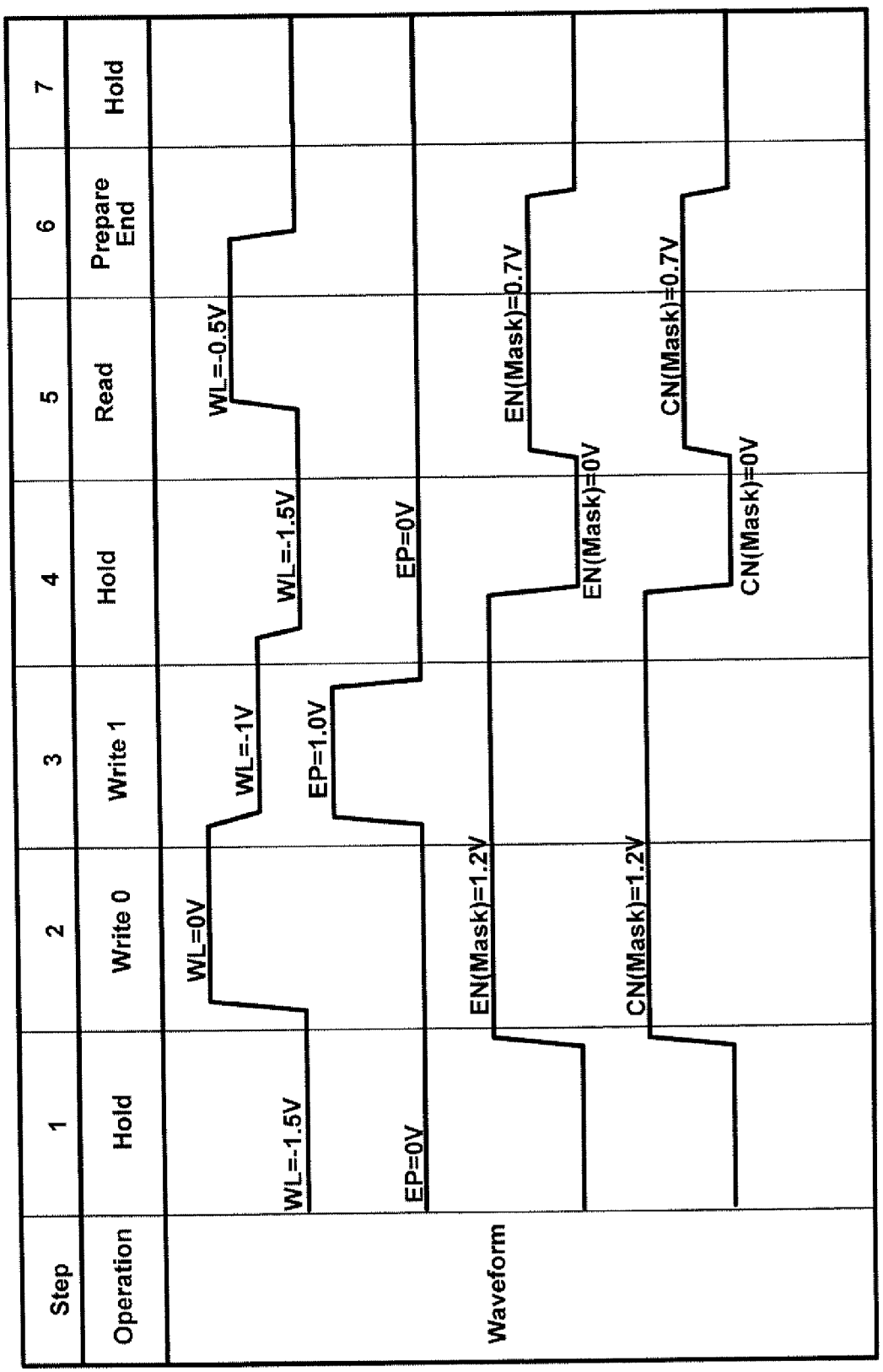
FIG. 9 shows control signal voltage waveforms of an alternative masking operation performed on one or more unselected memory cells along an active row to reduce a disturbance during active operations in accordance with an embodiment of the present disclosure.

Referring to FIG. 9, there are shown control signal voltage waveforms of an alternative masking operation performed on one or more unselected memory cells 12 along an active row to reduce a disturbance during active operations in accordance with an embodiment of the present disclosure. For example, during one or more active operations (e.g., read operation, write operation, sense operation, preparation operation, and/or refresh operation), voltage potentials may be applied to every memory cell 12 along the active row via the word line (WL) 28 and/or the carrier injection line (EP) 34. However, the active operations may be performed on one or more selected memory cells 12 along the active row and one or more unselected memory cells 12 along the active row may experience a disturbance caused by the voltage potentials applied via the word line (WL) 28 and/or the carrier injection line (EP) 34 during the active operations. In order to reduce a disturbance experienced by the one or more unselected memory cells 12 along an active row, a masking operation may be performed on the one or more unselected memory cells 12.

In an exemplary embodiment, during a masking operation, a voltage potential may be applied to the one or more unselected memory cells 12 on an active row via the corresponding bit line (CN) 30 and/or the source line (EN) 32. The voltage potential applied via the corresponding bit line (CN) 30 and/or the source line (EN) 32 to the one or more unselected memory cells 12 on an active row via the corresponding bit line (CN) 30 and/or the source line (EN) 32 may vary based on one or more operations performed on the active row. The voltage potential applied to the one or more unselected memory cells 12 on the active row may be raised to a predetermined voltage potential above the voltage potential applied to the word line (WL) 28 and/or the carrier injection line (EP) 34. In an exemplary embodiment, the voltage potential applied to the bit line (CN) 30 and/or the source line (EN) 32 associated with the one or more unselected memory cells 12 along the active row may be 1.2V above a voltage potential applied to the word line (WL) 28 and may be similar to or greater than a voltage potential applied to the carrier injection line (EP) 34.

As shown in FIG. 9, the voltage potential applied to the bit line (CN) 30 and/or the source line (EN) 32 associated with the one or more unselected memory cells 12 along the active row may be 1.2V during a write logic low (e.g., binary "0" data state) operation and/or a write logic high (e.g., binary "1" data state) operation in order to reduce a disturbance caused by the one or more active operations. The voltage potential applied to the word line (WL) 28 may vary to perform different active operations, the voltage potential applied on the bit line (CN) 30 and/or the source line (EN) 32 may also vary corresponding to the varying voltage potential applied to the word line (WL) 28. In an exemplary embodiment, the voltage potential applied to the word line (WL) 28 may decrease by 0.5V (e.g., from 0V to −0.5V) in order to perform a read operation, the voltage potential applied to the bit line (CN) 30 and/or the source line (EN) 32 may also decrease by 0.5V (e.g., from 1.2V to 0.7V) in order to reduce a disturbance caused by the one or more active operations.

Figure 10:
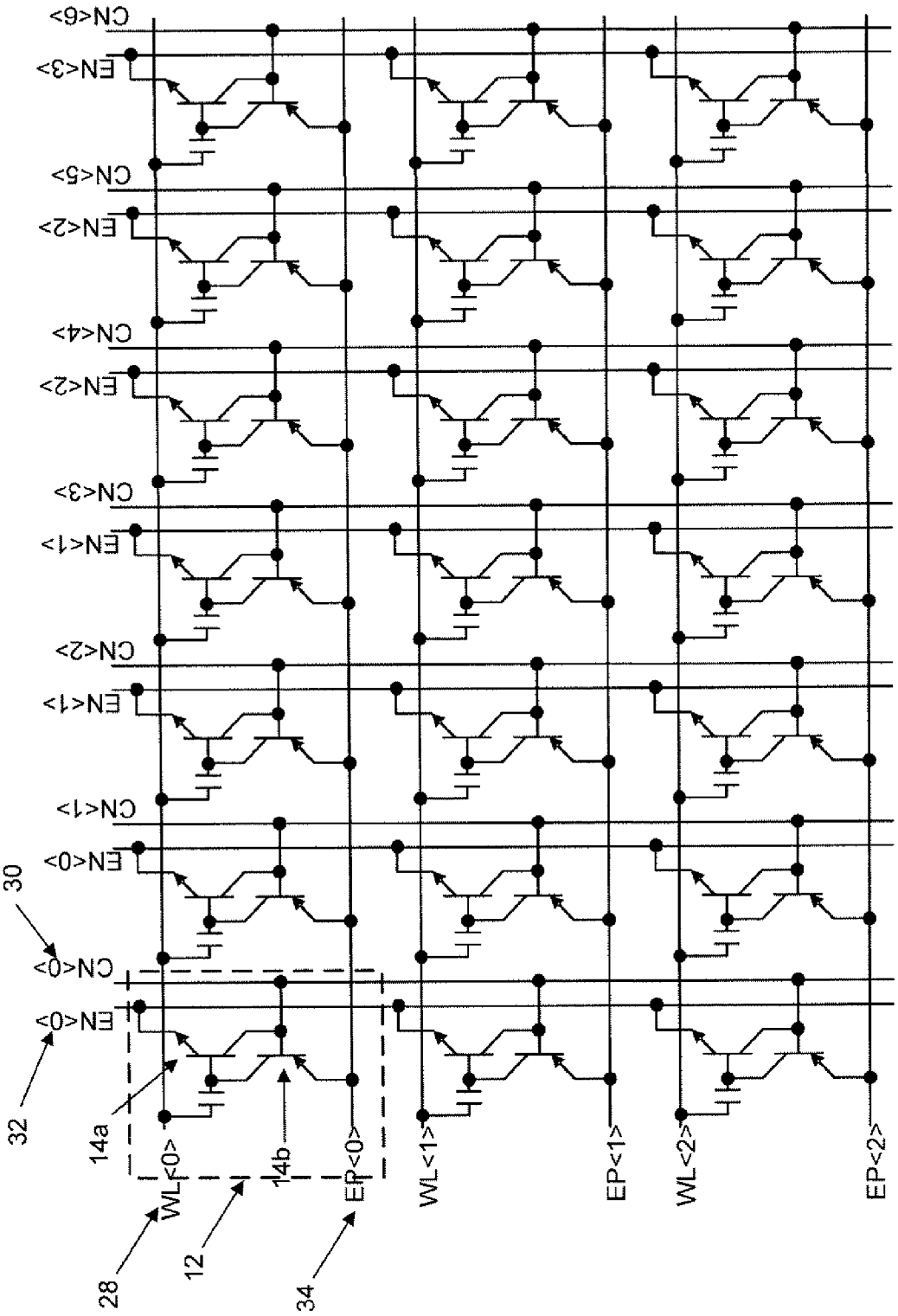
FIG. 10 shows a memory cell array having a plurality of memory cells with a shared source line (EN) in accordance with an embodiment of the present disclosure.

Referring to FIG. 10, there is shown a memory cell array 20 having a plurality of memory cells 12 with a shared source line (EN) 32 in accordance with an embodiment of the present disclosure. Each of the memory cells 12 may comprise a first bipolar transistor 14a and a second bipolar transistor 14b coupled to each other. For example, the first bipolar transistor 14a and/or the second bipolar transistor 14b may be an NPN bipolar transistor or an PNP bipolar transistor. As illustrated in FIG. 10, the first bipolar transistor 14a may be an NPN bipolar transistor and the second bipolar transistor 14b may be an PNP bipolar transistor. In another exemplary embodiment, the first memory transistor 14a may be an PNP bipolar transistor and the second memory transistor 14b may be an NPN bipolar transistor. The memory cells 12 may be coupled to a respective word line (WL) 28, a respective bit line (CN) 30, a respective source line (EN) 32, and/or a respective carrier injection line (EP) 34. In an exemplary embodiment, two columns of memory cells 12 may share a respective source line (EN) 32. Data may be written to or read from a selected memory cell 12 by applying suitable control signals to a selected word line (WL) 28, a selected bit line (CN) 30, a selected source line (EN) 32, and/or a selected carrier injection line (EP) 34.

In an exemplary embodiment, one or more respective bit line (CN) 30 may be coupled to one or more data sense amplifiers of the data write and sense circuitry 36. For example, one or more control signals may be applied to one or more selected memory cells 12 via a selected word line (WL) 28, a selected bit line (CN) 30, a selected source line (EN) 32, and/or a selected carrier injection line (EP) 34. A voltage and/or a current may be generated by the one or more selected memory cells 12 and outputted to the data write and sense circuitry 36 via a corresponding bit line (CN) 30 or via a corresponding source line (EN) 32. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from and/or written to the memory cell 12 via the bit line (CN) 30, then the bit line (CN) 30 may be coupled to the data sense amplifier of the data write and sense circuitry 36 while the source line (EN) 32 may be separately controlled via a voltage/current source (e.g., a voltage/current driver) of the data write and sense circuitry 36. In an exemplary embodiment, the data sense amplifier of the data write and sense circuitry 36 and the voltage/current source of the data write and sense circuitry 36 may be configured on opposite sides of the memory cell array 20.

In another exemplary embodiment, a voltage and/or current generated by the one or more selected memory cells 12 may be outputted to the data write and sense circuitry 36 via a corresponding source line (EN) 32. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from the memory cell 12 via the source line (EN) 32 and a data state is written to the memory cell 12 via the bit line (CN) 30, then the bit line (CN) 30 and the source line (EN) 32 may be coupled to the data sense amplifier of the data write and sense circuitry 36. In an exemplary embodiment, bit line (CN) 30 and the source line (EN) 32 may be coupled to disparate subcircuits (e.g., drivers and/or data sense amplifier circuitry) of the data write and sense circuitry 36 configured on opposite sides of the memory cell array 20. By reading a data state via the source line (EN) 32 and writing a data state via the bit line (CN) 30, the resistance at the memory cell 12 may be reduced because the source line (EN) 32 and the bit line (CN) 30 are driven separately.

Figure 11:
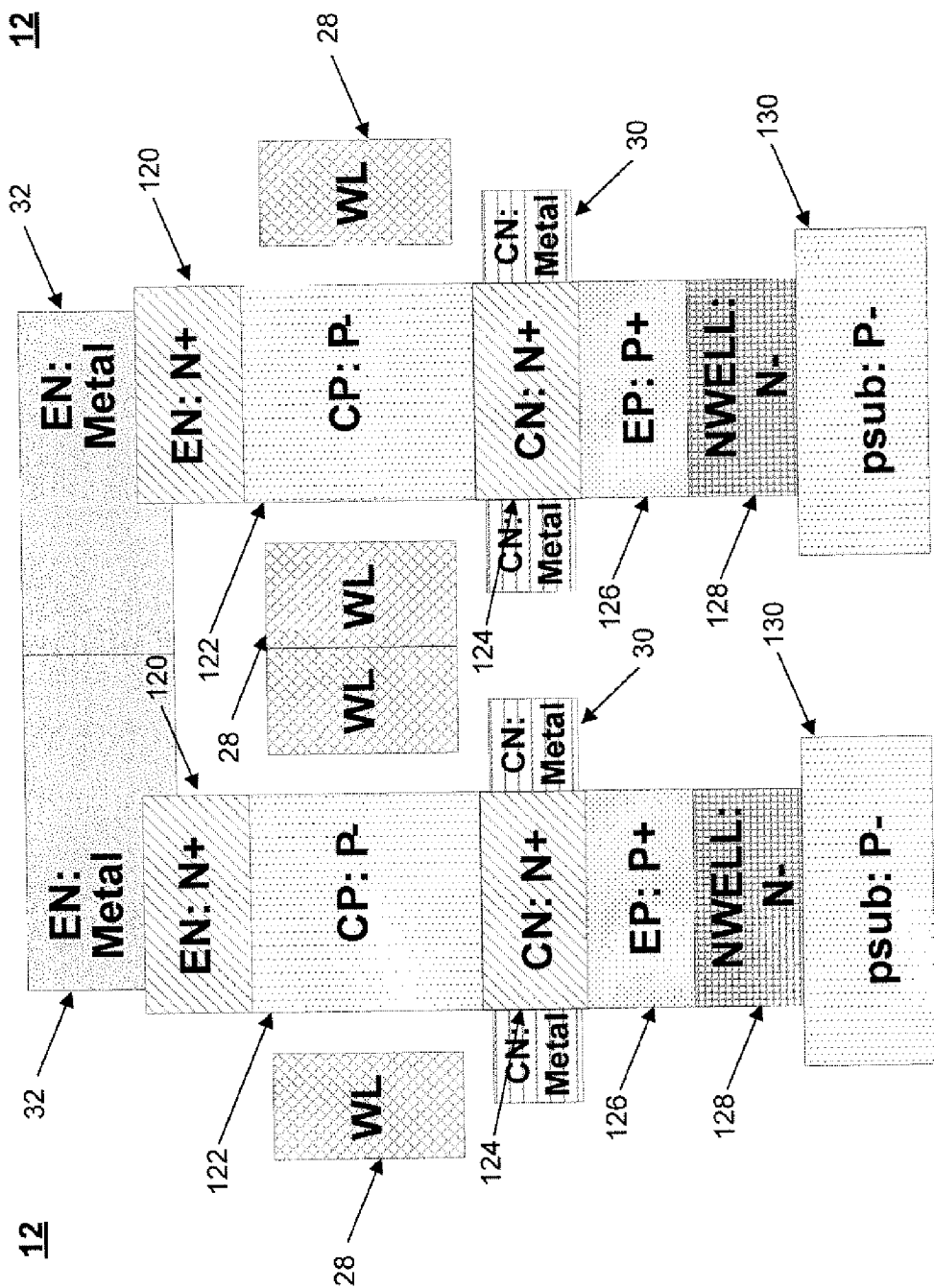
FIG. 11 shows a cross-sectional view of the memory cell with a shared source line (EN) in accordance with an embodiment of the present disclosure.

Referring to FIG. 11, there is shown a cross-sectional view of the memory cell 12 in accordance with an embodiment of the present disclosure. For example, two memory cells 12 may share a source line (EN) 32. As discussed above, the memory cell 12 may comprise two bipolar transistors. In an exemplary embodiment, the first bipolar transistor 14a may be a NPN bipolar transistor and the second bipolar transistor 14b may be a PNP bipolar transistor. In an exemplary embodiment, the first bipolar transistor 14a and the second bipolar transistor 14b may share one or more common regions. The first NPN bipolar transistor 14a may comprise an N+ emitter region 120, a P− base region 122, and an N+ collector region 124. The second PNP bipolar transistor 14b may comprise the P− collector region 122, the N+ base region 124, and a P+ emitter region 126. The N+ region 120, the P− region 122, the N+ region 124, and/or the P+ region 126 may be disposed in sequential contiguous relationship within a pillar or fin configuration that may extend vertically or perpendicularly to a plane defined by an N-well region 128 and/or a P− substrate 130.

The N+ emitter region 120 of the first bipolar transistor 14a may be coupled to the source line (EN) 32 formed of a metal layer. Also, the P− base region 122 of the first bipolar transistor 14a and/or the P− collector region 122 of the second bipolar transistor 14b may be capacitively coupled to the word line (WL) 28 formed of a metal layer. In another exemplary embodiment, the N+ region 124 of the memory cell 12 may be coupled to a bit line (CN) 30 formed of a metal layer. The bit line (CN) 30 may reduce a disturbance to the memory cell 12. In particular, the bit line (CN) 30 may be formed of a metal layer and therefore may reduce a hole disturbance to the memory cell 12. The bit line (CN) 30 may be formed in parallel to the source line (EN) 32 coupled to a plurality of memory cells 12 (e.g., via a corresponding N+ region 124). For example, the bit line (CN) 30 and the source line (EN) 32 may be arranged in different planes and configured to be parallel to each other. The bit line (CN) 30 may provide an alternate manner of addressing or accessing the memory cell 12. The memory cell 12 may be addressed or accessed via either the bit line (CN) 30 or the source line (EN) 32, or the combination of the bit line (CN) 30 and the source line (EN) 32.

Figure 12:
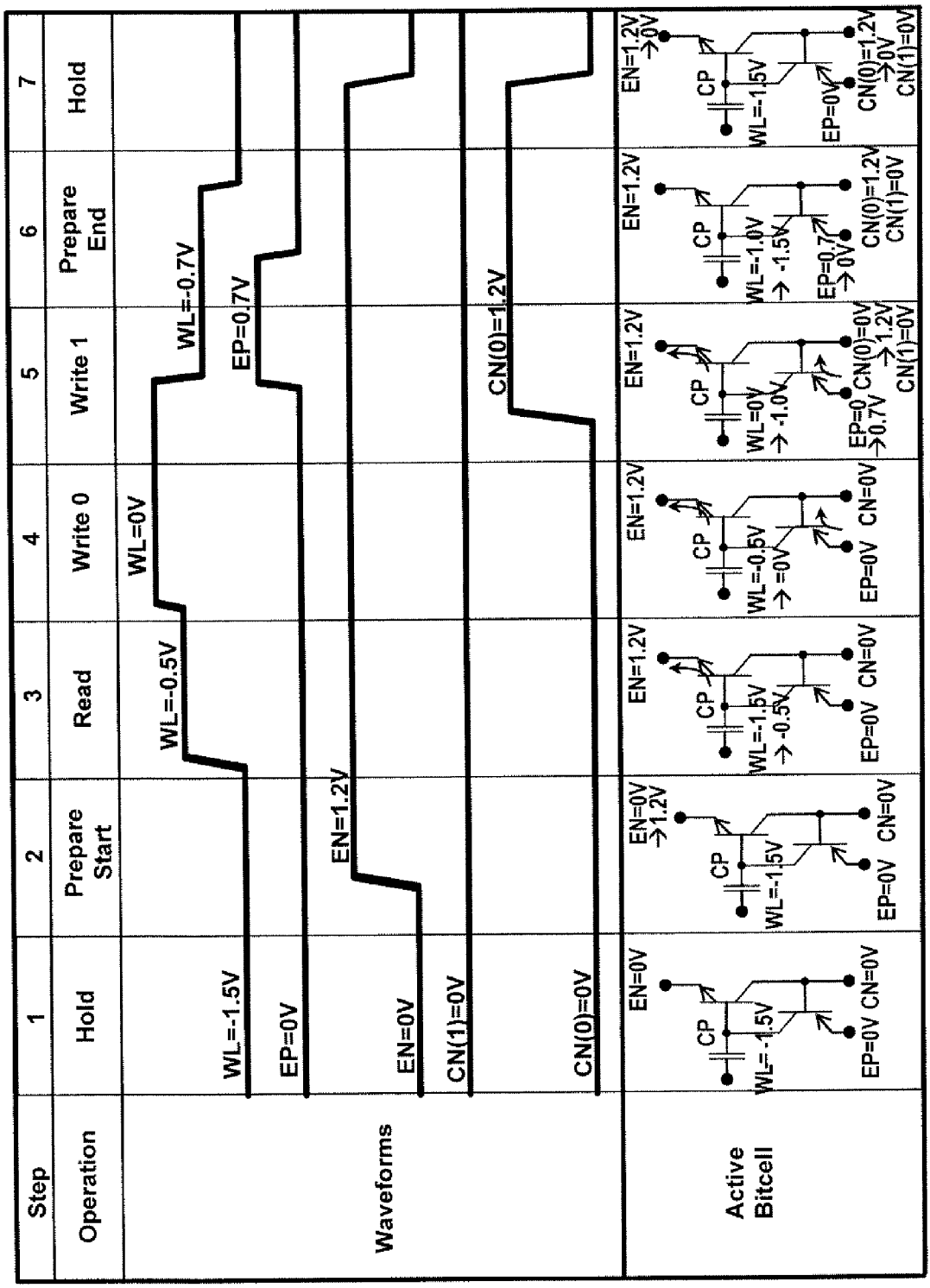
FIG. 12 shows control signal voltage waveforms for performing a refresh operation for a memory cell array having a plurality of memory cells with a shared source line (EN) in accordance with an embodiment of the present disclosure.

Referring to FIG. 12, there are shown control signal voltage waveforms for performing a refresh operation for a memory cell array 20 having a plurality of memory cells 12 with a shared source line (EN) 32 in accordance with an embodiment of the present disclosure. For example, the refresh operation may include control signals configured to perform one or more active operations. In an exemplary embodiment, the refresh operation may include control signals configured to perform a preparation to start operation, a read operation, a write logic low (e.g., binary "0" data state) operation, a write logic high (e.g., binary "1" data state) operation, and/or a preparation to end operation. Prior to performing a refresh operation, the control signals may be configured to perform a hold operation in order to maintain a data state (e.g., a logic high (binary "1" data state) or a logic low (binary "0" data state)) stored in the memory cell 12. In particular, the control signals may be configured to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to the P− region 122 of the memory cell 12, while voltage potentials applied to other regions (e.g., the N+ region 120, the N+ region 124, and/or the P+ region 126) may be maintained at 0V. For example, the negative voltage potential applied to the word line (WL) 28 (e.g., capacitively coupled to the P− region 122 of the memory cell 12) may be −1.5V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include control signals to perform a preparation to start operation where the control signals may be applied to a memory cell 12 in order to prepare the memory cell 12 for one or more subsequent operations (e.g., a read operation and/or a write operation). For example, control signals applied to a memory cell 12 may be configured to minimize time delay between voltages applied to the N+ region 124 of the memory cell 12 and the word line (WL) 28 in order to reduce a disturbance. For example, during a subsequent operation (e.g., a read operation), a 1.2V is applied to the source line (EN) 32, a 0V is applied to the bit line (CN) 30, and a −1.5V is applied to the word line (WL) 28, an electric field may be created across the junction from the P− region 122 and the N+ region 124. The electric field may cause a leakage (e.g., a logic high (binary "1" data state)) or an increase (e.g., a logic low (binary "0" data state)) of amount of charge stored in the memory cell 12, or a band-to-band tunneling (e.g., gate-induced drain leakage "GIDL"). Therefore, control signals applied to a memory cell 12 during the preparation to start operation may be configured to reduce band-to-band tunneling (e.g., gate-induced drain leakage "GIDL") by precharging the source line (EN) 32 to a predetermined voltage potential. In an exemplary embodiment, a positive voltage potential may be applied to the N+ region 120 of the memory cell 12, while the voltage potential applied to other regions (e.g., the N+ region 120, the capacitively coupled P− region 122 via the word line (WL) 28, and/or the P+ region 126) of the memory cell 12 may maintain the same as the voltage potential applied during the hold operation. The positive voltage potential applied to the N+ region 120 of the memory cell 12 may be 1.2V, while the voltage potential applied to other regions of the memory cell 12 may be maintained at 0V.

In another exemplary embodiment, a refresh operation may control signals to perform a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (CN) 30. In an exemplary embodiment, a voltage potential applied to the word line (WL) 28 (e.g., capacitively coupled to the P− region 122) and/or a voltage potential applied to the N+ region 120 via the source line (EN) 32 may be raised to a predetermined voltage potential. In another exemplary embodiment, in the event that the memory cell 12 has been prepared for the read operation (e.g., prepare to start operation as discussed above), the voltage potential applied to the N+ region 120 of the memory cell 12 may remain the same as the voltage potential applied during the preparation to start operation. For example, the voltage potential applied to the word line (WL) 28 (e.g., capacitively coupled to the P− region 122 of the memory cell 12) may be raised to −0.5V, while the voltage potential applied to the N+ region 120 of the memory cell 12 may be 1.2V.

Once the voltage potential applied to the word line (WL) 28 (e.g., capacitively coupled to the P− region 122 of the memory cell 12) is raised to −0.5V and a logic high (e.g., binary "1" data state) is written to the memory cell 12, the junction between the P− region 122 and the N+ region 120 may become forward biased. When the first bipolar transistor 14a switches to an "ON" state, a change in voltage and/or current may be generated in the memory cell 12. This change in voltage and/or current may be outputted to and detected by a data sense amplifier via the bit line (CN) 30 coupled to the N+ region 124. In another exemplary embodiment, when the voltage potential applied to the word line (WL) 28 (e.g., capacitively coupled to the P− region 122 of the memory cell 12) is raised to −0.5V and a logic low (e.g., binary "0" data state) is stored in the memory cell 12, the junction between the P− region 122 and the N+ region 120 may remain reverse biased or become weakly forward biased (e.g., above the reverse bias voltage and below forward bias threshold voltage). When the first bipolar transistor 14a remains in the "OFF" state, no change in voltage and/or current is generated in the memory cell 12. Thus, a data sense amplifier may detect no change in voltage and/or current via the bit line (CN) 30 coupled to the N+ region 124. The voltage potential applied during a read operation may not switch the second bipolar transistor 14b to an "ON" state. The second bipolar transistor 14b may remain in an "OFF" state during the entire read operation.

In other exemplary embodiments, a refresh operation may include control signals to perform a write logic low (e.g., binary "0" data state) operation where the control signals may be configured to perform one or more write operations to one or more selected memory cells 12 of one or more selected rows of the memory cell array 20. For example, the write logic low (e.g., binary "0" data state) operation may be performed on one or more selected rows of the memory cell array 20, or the entire memory cell array 20, and a subsequent write logic high (e.g., binary "1" data state) operation may be performed on one or more selected memory cells 12. For example, a voltage potential applied to the word line (WL) 28 may be adjusted such that, the voltage potential at the P– region 122 (e.g., by capacitively coupling to the word line (WL) 28) may be higher than a voltage potential applied to the bit line (CN) 30 and/or the source line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P– region 122) may be raised to 0V. Also, a voltage potential applied to the source line (EN) 32 may remain the same as the voltage potential applied during the read operation. Power may be saved by eliminating switching or maintaining the voltage potential applied via the source line (EN) 32 during the read operation and the write logic low (e.g., binary "0" data state) operation. In an exemplary embodiment, when the voltage potential applied to the N+ region 120 via the source line (EN) is maintained at 1.2V, and a logic high (e.g., binary "1" data state) is stored in the memory cell 12, the first bipolar transistor 14a (e.g., regions 120-124) may be switched to an "ON" state and the second bipolar transistor 14b (e.g., regions 122-126) may remain in an "OFF" state to remove stored charges from the P– region 122. In another exemplary embodiment, when the voltage potential applied to the N+ region 120 via the source line (EN) 32 is maintained at 1.2V and a logic low (e.g., binary "0" data state) is stored in the memory cell 12, the junction between the N+ region 120 and the P– region 122 may not be forward biased and the junction between the P– region 122 and the N+ region 124 may not be forward biased or become weakly forward biased (e.g., above the reverse bias voltage and below forward bias threshold voltage) and the logic low (e.g., binary "0" data state) may be maintained in the memory cell 12.

In another exemplary embodiment, a refresh operation may include control signals to perform a write logic high (e.g., binary "1" data state) operation where the control signals may be configured to write a logic high (e.g., binary "1" data state) to the one or more selected memory cells 12. For example, a predetermined voltage potential may be applied to the word line (WL) 28 (e.g., capacitively coupled to the P– region 122), the N+ region 124 via the bit line (CN) 30, the N+ region 120 via the source line (EN) 32, and/or the P+ region 126 via the carrier injection line (EP) 34. In an exemplary embodiment, in preparation to perform the write logic high (e.g., binary "1" data state), the voltage potential applied to the N+ region 124 of the one or more selected memory cells 12 may be maintained at 0V. The voltage potential applied to the N+ region 124 of the one or more unselected memory cells 12 may be raised to 1.2V or higher (e.g., 0.7V-1.2V) in order to prevent a write logic high (e.g., binary "1" data state) operation on the one or more unselected memory cells 12. The voltage potential applied to the N+ region 120 via the source line (EN) 32 may be maintained at a voltage potential of 1.2V. After applying the desired voltage potential to the N+ region 120 and/or the N+ region 124, a voltage potential applied to the P+ region 126 via the carrier injection line (EP) 34 may be raised to 0.7V. Further, the voltage potential applied to the word line (WL) 28 (e.g., capacitively coupled to the P– region 122) may be lowered to –0.7V.

Under such biasing, the junction between the N+ region 120 and the P– region 122 may be reverse biased and the junction between the P– region 122 and the N+ region 124 may become forward biased so that a logic high (e.g., binary "1" data state) may be written to the P– region 122 (e.g., charge injection into the P– region 122 from the P+ region 126). As more charges are accumulated in the P– region 122, the voltage potential at the P– region 122 may increase to approximately 0.7V to 1.0V above the voltage potential at N+ region 124. At this time, the first bipolar transistor 14a may start to switch to an "ON" state and the current generated by the first bipolar transistor 14a may increase the voltage potential at N+ region 124 due to resistive voltage drop on the bit line (CN) 30. The increase of the voltage potential at N+ region 124 may lead to a decrease of current flow in the second bipolar transistor 14b which in term may cause a decrease in the current load on the carrier injection line (EP) 34. In other exemplary embodiments, the N+ region 124 may be floating after pre-charged to a predetermined voltage potential (e.g., 0V as discussed above) in order to reduce a current flow within the second bipolar transistor 14b after a write logic high (e.g., binary "1" data state) operation has been completed. Thus, during a write logic high (e.g., binary "1" data state) operation, the first bipolar transistor 14a may easily increase a voltage potential at the N+ region 124 when the P– region 122 is fully charged.

In order to maintain a logic low (e.g., binary "0" data state) in one or more unselected memory cells 12, a masking operation may be performed on the one or more unselected memory cells 12 on an active row. For example, the voltage potential applied to the N+ region 124 of the one or more unselected memory cells 12 may be maintained at 0.7V or higher (e.g., 1.2V) in order to prevent charge flow into the P– region 122 via the P+ region 126. Under such biasing, the junction between the N+ region 120 and the P– region 122 may not be forward biased and the junction between the P+ region 126 and the N+ region 124 may be reverse biased or become weakly forward biased (e.g., above the reverse bias voltage and below forward bias threshold voltage) to prevent charge flow and the logic low (e.g., binary "0" data state) may be maintained in the memory cell 12.

The refresh operation may also include control signals to perform a preparation to end operation. During the preparation to end operation, the voltage potentials applied to the memory cells 12 may adjust the amount of charge (e.g., an indication of the data state) stored in the P– region 122 of the memory cells 12. In an exemplary embodiment, a voltage potential applied to the word line (WL) 28 (e.g., capacitively coupled to the P– region 122) may be lowered to –1.5V in order to switch the first bipolar transistor 14a to an "OFF" state. As discussed above, the P– region 122 may be charged to a voltage potential that is approximately 0.7V above the voltage potential at the N+ region 124 during the write logic high (e.g., binary "1" data state) operation. The voltage potential applied to the word line (WL) 28 may be lowered to –1.5V and may determine an amount of charge accumulated in P– region 122 of the memory cells 12. In an exemplary embodiment, approximately 1.0V may be accumulated in the P– region 122 of the memory cell 12 when the voltage potential on the word line (WL) 28 is –0.7V, however, when the voltage potential on the word line (WL) 28 is lowered to –1.5V (e.g., a holding voltage potential) the voltage potential at the P– region 122 may be lowered by 0.8V due to the capacitively coupling of the voltage potential to the word line (WL) 28.

The voltage potential applied to the word line (WL) 28 during the write logic high (e.g., binary "1" data state) operation may be selected based on one or more factors. For example, the one or more factors may include a disturbance (e.g., disturbance may increase with an increase in the amount of charge accumulated/stored in the P– region 122 of the memory cells 12), charge time (e.g., charge time may increase with an increase in the amount of charge accumulated/stored in the P– region 122 of the memory cells 12), and retention time (e.g., retention time may increase with an increase in the amount of charge stored in the P– region 122 of the memory cells 12). Also, a voltage potential applied to the N+ region 124 via the bit line (CN) 30 may remain at 1.2V for one or more memory cells 12 that are storing a logic low (e.g., binary "0" data state) during the preparation to end operation in order to maintain the second bipolar transistor 14b in the "OFF" state. After the refresh operation, the voltage potentials applied to the memory cells 12 may be returned to the hold operation in order to retain a data state (e.g., logic low (binary "0" data state) or logic high (binary "1" data state)).

Figure 13:
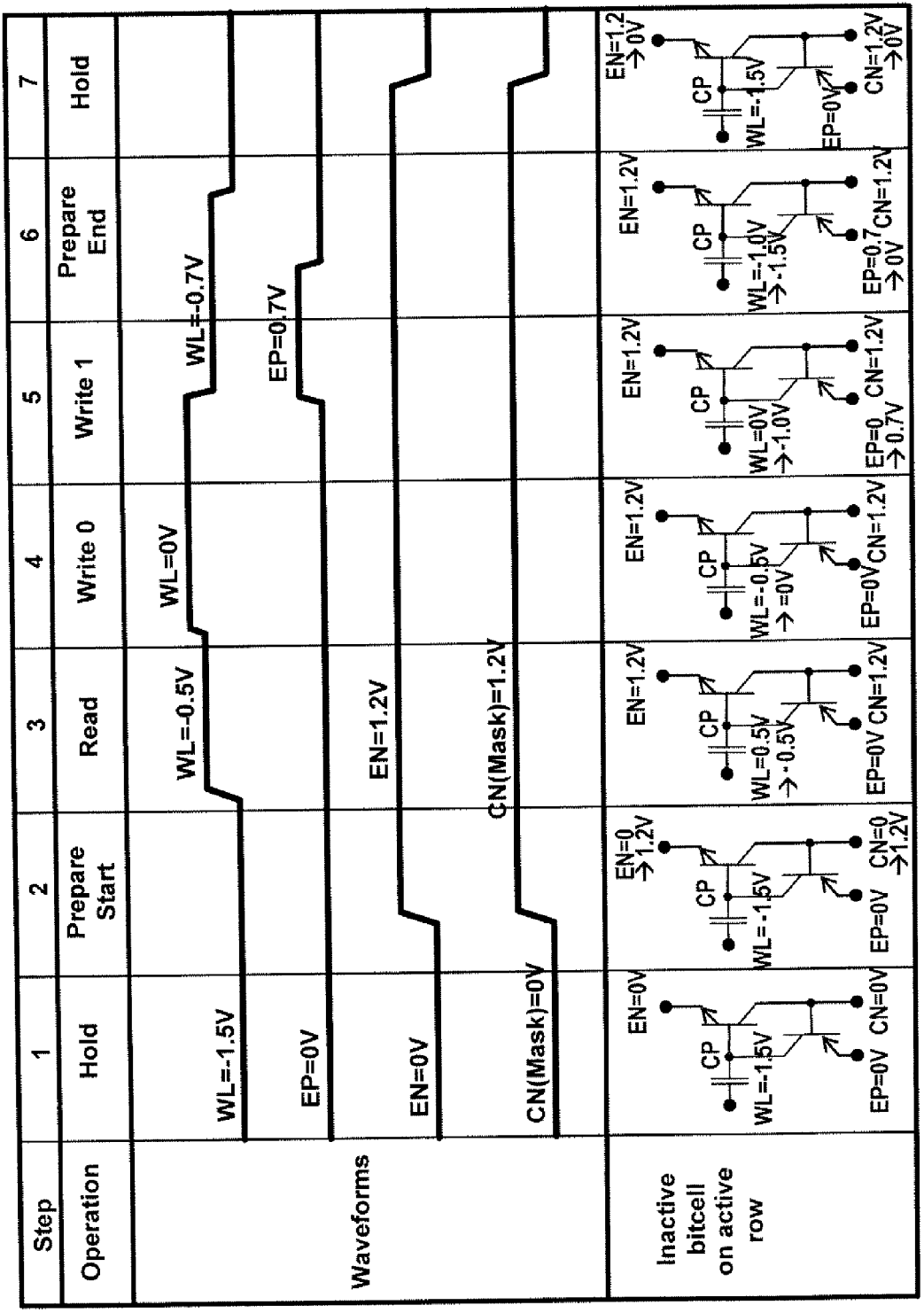
FIG. 13 shows control signal voltage waveforms of a masking operation performed on one or more unselected memory cells along an active row of a memory cell array having a plurality of memory cells with a shared source line (EN) in order to reduce a disturbance during active operations in accordance with an embodiment of the present disclosure.

Referring to FIG. 13, there are shown control signal voltage waveforms of a masking operation performed on one or more unselected memory cells 12 along an active row of a memory cell array 20 having a plurality of memory cells 12 with a shared source line (EN) 32 in order to reduce a disturbance during active operations in accordance with an embodiment of the present disclosure. For example, during one or more active operations (e.g., read operation, write operation, sense operation, preparation operation, and/or refresh operation), voltage potentials may be applied to every memory cell 12 along an active row via the word line (WL) 28 and/or the carrier injection line (EP) 34. However, the active operations may be performed on one or more selected memory cells 12 along the active row and one or more unselected memory cells 12 along the active row may experience a disturbance caused by the voltage potentials applied via the word line (WL) 28 and/or the carrier injection line (EP) 34 during the active operations to one or more selected memory cells 12. In order to reduce a disturbance experienced by the one or more unselected memory cells 12 along an active row, a masking operation may be performed on the one or more unselected memory cells 12.

In an exemplary embodiment, during a masking operation, a voltage potential may be applied to the one or more unselected memory cells 12 on an active row via the corresponding bit line (CN) 30 and/or the source line (EN) 32. The voltage potential applied via the corresponding bit line (CN) 30 and/or the source line (EN) 32 to the one or more unselected memory cells 12 on an active row via the corresponding bit line (CN) 30 and/or the source line (EN) 32 may remain constant during one or more operations performed on the active row. The voltage potential applied to the one or more unselected memory cells 12 on the active row may be raised to a predetermined voltage potential above the voltage potential applied to the word line (WL) 28 and may be similar to or greater than a voltage potential applied to the carrier injection line (EP) 34. In an exemplary embodiment, the voltage potential applied to the bit line (CN) 30 and/or the source line (EN) 32 associated with the one or more unselected memory cells 12 along the active row may be 1.2V (e.g., 0.7V or higher) above a voltage potential applied to the word line (WL) 28 and/or the carrier injection line (EP) 34.

As shown in FIG. 13, the voltage potential applied to the bit line (CN) 30 and/or the source lane (EN) 32 associated with the one or more unselected memory cells 12 along the active row may remain at 1.2V during a preparation to start operation, a read operation, a write logic low (e.g., binary "0" data state) operation, a write logic high (e.g., binary "1" data state) operation, and/or the preparation to end operation in order to reduce a disturbance caused by the one or more active operations.

At this point it should be noted that providing a direct injection semiconductor memory device in accordance with the present disclosure as described above typically involves the processing of input data and the generation of output data to some extent. This input data processing and output data generation may be implemented in hardware or software. For example, specific electronic components may be employed in a direct injection semiconductor memory device or similar or related circuitry for implementing the functions associated with providing a direct injection semiconductor memory device in accordance with the present disclosure as described above. Alternatively, one or more processors operating in accordance with instructions may implement the functions associated with providing a direct injection semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A direct injection semiconductor memory device comprising:
 a first region coupled to a source line, wherein the first region is one of the plurality of first regions in a column of an array of direct injection semiconductor devices, wherein the source line is coupled to and shared with at least some of the plurality of second regions in the column;
 a second region coupled to a bit line, wherein the second region is one of a plurality of second regions in a column of an array of direct injection semiconductor devices, wherein the bit line is coupled to and shared with at least some of the plurality of second regions in the column;

a body region spaced apart from and capacitively coupled to a word line, wherein the body region is electrically floating and disposed between the first region and the second region; and a third region, disposed adjacent the second region and coupled to a carrier injection line, configured to inject charges into the body region through the second region;

wherein the first region, the second region, the body region, and the third region are disposed in a sequential contiguous configuration extending substantially vertically from a horizontal plan defined by a least a substrate.

2. The direct injection semiconductor memory device according to claim 1, wherein the first region, the body region, and the second region forms a first bipolar transistor.

3. The direct injection semiconductor memory device according to claim 2, wherein the body region, the second region, and the third region forms a second bipolar transistor.

4. The direct injection semiconductor memory device according to claim 1, wherein the carrier injection line contacts the third region.

5. The direct injection semiconductor memory device according to claim 1, wherein the bit line extends from the second region horizontally parallel to the source line.

6. The direct injection semiconductor memory device according to claim 1, wherein the word line extends from near the body region horizontally parallel to the carrier injection line.

7. The direct injection semiconductor memory device according to claim 1, further comprises a fourth region disposed between the third region and a substrate.

8. The direct injection semiconductor memory device according to claim 7, wherein the fourth region is N-doped region and the substrate is a P-type substrate.

9. The direct injection semiconductor memory device according to claim 1, wherein the first region and the second region are N-doped regions.

10. The direct injection semiconductor memory device according to claim 1, wherein the body region and the third region are P-doped regions.

11. A method for providing a direct injection semiconductor memory device comprising the steps of:

coupling a first region to a source line, wherein the first region is one of a plurality of first regions in a column of an array of direct injection semiconductor devices, wherein the source line is coupled to and shared with the plurality of the first regions in the column;

coupling a second region to a bit line, wherein the second region is one of a plurality of second regions in a column of an array of direct injection semiconductor devices, wherein the bit line is coupled to and shared with at least some of the plurality of second regions in the column;

coupling a body region spaced apart from and capacitively to a word line, wherein the body region is electrically floating and disposed between the first region and the second region; and coupling a third region to a carrier injection line configured to inject charges into the body region through the second region, wherein the third region is disposed adjacent the second region;

wherein the first region, the second region, the body region, and the third region are disposed in a sequential contiguous configuration extending substantially vertically from a horizontal plane defined by at least a substrate.

12. The method according to claim 11, further comprising increasing a voltage potential applied to at least one of the first region via the source line and the second region via the bit line from a voltage potential applied to the at least one of the first region and the second region during a hold operation to prepare for an active operation.

13. The method according to claim 11, further comprising increasing a voltage potential applied to the word line from a voltage potential applied to the word line during a hold operation to perform at least one of a read operation and a write logic low operation.

14. The method according to claim 11, further comprising lowering a voltage potential applied to the word line from a voltage potential applied to the word line during a write logic low operation to perform a write logic high operation.

15. The method according to claim 11, further comprising increasing a voltage potential applied to the third region via the carrier injection line from a voltage potential applied to the third region during a hold operation to perform a write logic high operation.

16. The method according to claim 15, further comprising increasing a voltage potential applied to the second region via the bit line from a voltage potential applied during a holding operation in order to mask the write logic high operation.

17. The method according to claim 11, further comprising increasing a voltage potential applied to the first region via the source line from a voltage potential applied to the first region during a hold operation to perform a write logic high operation.

18. The method according to claim 11, further comprising increasing a voltage potential applied to the first region via the source line from a voltage potential applied to the first region during a hold operation to perform a masking operation.

19. The method according to claim 18, further comprising increasing a voltage potential applied to the second region via the bit line from a voltage potential applied to the second region during a hold operation to perform a masking operation.

20. The method according to claim 19, wherein the voltage potential applied to the first region via the source line or the second region via the bit line is higher than a voltage potential applied to the word line.

21. The method according to claim 20, wherein the voltage potential applied to the first region via the source line or the second region via the bit line is higher than the voltage potential applied to the third region during a write logic high operation.

* * * * *